(12) United States Patent
Zhou et al.

(10) Patent No.: US 11,937,444 B2
(45) Date of Patent: Mar. 19, 2024

(54) FLEXIBLE DISPLAY SUBSTRATE HAVING FIRST AND SECOND BONDING REGIONS, DISPLAY PANEL, DISPLAY DEVICE, AND MANUFACTURING METHOD

(71) Applicants: Chengdu BOE Optoelectronics Technology Co., Ltd., Sichuan (CN); BOE Technology Group Co., Ltd., Beijing (CN)

(72) Inventors: Hongjun Zhou, Beijing (CN); Hengzhen Liang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 764 days.

(21) Appl. No.: 17/047,777

(22) PCT Filed: Mar. 19, 2020

(86) PCT No.: PCT/CN2020/080269
§ 371 (c)(1),
(2) Date: Oct. 15, 2020

(87) PCT Pub. No.: WO2020/192556
PCT Pub. Date: Oct. 1, 2020

(65) Prior Publication Data
US 2021/0175465 A1 Jun. 10, 2021

(30) Foreign Application Priority Data
Mar. 26, 2019 (CN) .......................... 201910233814.2

(51) Int. Cl.
*H10K 50/842* (2023.01)
*H10K 50/844* (2023.01)
(Continued)

(52) U.S. Cl.
CPC ....... *H10K 50/8426* (2023.02); *H10K 50/844* (2023.02); *H10K 71/00* (2023.02); *H10K 77/111* (2023.02); *H10K 2102/311* (2023.02)

(58) Field of Classification Search
None
See application file for complete search history.

(56) References Cited

U.S. PATENT DOCUMENTS

2012/0080789 A1 4/2012 Shiota et al.
2013/0120329 A1 5/2013 Wang et al.
(Continued)

FOREIGN PATENT DOCUMENTS

CN 102460668 A 5/2012
CN 102543896 A 7/2012
(Continued)

OTHER PUBLICATIONS

International search report of PCT application No. PCT/CN2020/080269 dated Jun. 23, 2020.
(Continued)

*Primary Examiner* — Nduka E Ojeh
(74) *Attorney, Agent, or Firm* — Lippes Mathias LLP

(57) ABSTRACT

Provided are a flexible display substrate, a display panel, a display device, and a manufacturing method, relating to the technical field of display. The flexible display substrate is provided with a first bonding and a second bonding region. The first bonding region and the second bonding region are configured to be bonded to an electronic component, and a thickness of the flexible display substrate in the first bonding region is greater than a thickness of the flexible display substrate in the second bonding region in a direction perpendicular to the flexible display substrate.

18 Claims, 10 Drawing Sheets

(51) Int. Cl.
H10K 71/00 (2023.01)
H10K 77/10 (2023.01)
H10K 102/00 (2023.01)

(56) References Cited

U.S. PATENT DOCUMENTS

| | | | |
|---|---|---|---|
| 2015/0123270 A1 | 5/2015 | Tsukiyama et al. | |
| 2016/0020422 A1* | 1/2016 | Kim | H10K 50/824 257/40 |
| 2017/0259568 A1 | 9/2017 | Dodd et al. | |
| 2017/0365653 A1* | 12/2017 | Kim | H10K 59/131 |
| 2018/0047315 A1 | 2/2018 | Li et al. | |
| 2018/0226454 A1 | 8/2018 | Liu et al. | |
| 2018/0358413 A1 | 12/2018 | Lee et al. | |
| 2019/0131363 A1 | 5/2019 | Xie et al. | |
| 2019/0148327 A1 | 5/2019 | Chen et al. | |
| 2019/0148653 A1 | 5/2019 | Chen et al. | |
| 2019/0363275 A1 | 11/2019 | Ochi et al. | |
| 2019/0394869 A1* | 12/2019 | Kim | H05K 1/0281 |
| 2020/0194363 A1 | 6/2020 | Chen et al. | |
| 2021/0321517 A1* | 10/2021 | Kim | H05K 1/181 |

FOREIGN PATENT DOCUMENTS

| | | |
|---|---|---|
| CN | 104637826 A | 5/2015 |
| CN | 105720028 A | 6/2016 |
| CN | 106775173 A | 5/2017 |
| CN | 107464503 A | 12/2017 |
| CN | 107564923 A | 1/2018 |
| CN | 107621710 A | 1/2018 |
| CN | 107706156 A | 2/2018 |
| CN | 107768415 A | 3/2018 |
| CN | 207303146 U | 5/2018 |
| CN | 108400145 A | 8/2018 |
| CN | 109003997 A | 12/2018 |
| CN | 109949703 A | 6/2019 |
| JP | 2013207115 A | 10/2013 |
| KR | 20060109631 A | 10/2006 |
| WO | WO2018179308 A1 | 10/2018 |

OTHER PUBLICATIONS

First Office Action of Chinese Application No. 201910233814.2 dated Sep. 2, 2020.
Second Office Action of Chinese Application No. 201910233814.2 dated Jan. 18, 2021.

* cited by examiner

FLEXIBLE DISPLAY SUBSTRATE HAVING FIRST AND SECOND BONDING REGIONS, DISPLAY PANEL, DISPLAY DEVICE, AND MANUFACTURING METHOD

CROSS-REFERENCE TO RELATED APPLICATION

The present application is a 371 of PCT Application No. PCT/CN2020/080269, filed on Mar. 19, 2020, which claims priority to Chinese Patent Application No. 201910233814.2, filed on Mar. 26, 2019 and entitled "FLEXIBLE DISPLAY SUBSTRATE, DISPLAY PANEL, DISPLAY DEVICE, AND MANUFACTURING METHOD", the entire contents of which are incorporated herein by reference.

TECHNICAL FIELD

The present disclosure relates to the technical field of display, and in particular to a flexible display substrate, a display panel, a display device, and a manufacturing method of a flexible display substrate.

BACKGROUND

Flexible display substrates are more and more widely uses in organic light-emitting diode (OLED) display devices due to their characteristics of light weight, thinness, and good impact resistance. An OLED display device usually includes a flexible display substrate and a driver integrated circuit (IC). The driver IC is bonded to the flexible display substrate.

SUMMARY

Embodiments of the present disclosure provide a flexible display substrate, a display device, and a manufacturing method of a flexible display substrate.

In one aspect, embodiments of the present disclosure provide a flexible display substrate. The flexible display substrate is provided with a first bonding region and a second bonding region; wherein the first bonding region and the second bonding region are configured to be bonded to an electronic component, and a thickness of the flexible display substrate in the first bonding region is greater than a thickness of the flexible display substrate in the second bonding region in a direction perpendicular to the flexible display substrate.

Optionally, the first bonding region is configured as a signal transmission region between the flexible display substrate and the electronic component, and the second bonding region is configured as a non-signal transmission region between the flexible display substrate and the electronic component.

Optionally, the flexible display substrate includes a flexible base substrate and a plurality of film layers on the flexible base substrate, wherein the film layers in the second bonding region and at least part of the film layers in the first bonding region are in the same layer.

Optionally, the number of film layers in the first bonding region is greater than the number of film layers in the second bonding region, and a thickness of the film layers in the first bonding region is equal to a thickness of the film layers that are in the same layer in the second bonding region.

Optionally, the number of film layers in the first bonding region is greater than or equal to the number of film layers in the second bonding region, and for non-metal layers in the same layer in the first bonding region and the second bonding region, a thickness of the non-metal layers in the second bonding region is less than a thickness of the non-metal layers in the first bonding region.

Optionally, the film layers in the first bonding region include m metal layers and x non-metal layers, the film layers in the second bonding region include n metal layers and y non-metal layers, wherein m and n are positive integers, x and y are integers not less than 0, and m, n, x, and y meet any of the following relationships: m>n, x>y; m>n, x=y; and m=n, x>y.

Optionally, the film layers in the first bonding region include m metal layers and x non-metal layers, the film layers in the second bonding region include n metal layers and y non-metal layers, wherein m, n, x, and y are positive integers, m≥n, and x≥y;

a thickness of the metal layer in the first bonding region is equal to a thickness of the metal layers in the same layer in the second bonding region, and a thickness of at least one non-metal layer in the second bonding region is less than a thickness of the non-metal layers in the same layer in the first bonding region.

Optionally, the film layers in the first bonding region and the second bonding region are arranged according to any of the following configurations:

the film layers in the first bonding region include a gate layer, an interlayer dielectric layer, and a source and drain layer that are sequentially on the base substrate, and the film layers in the second bonding region include an interlayer dielectric layer and a source and drain layer that are sequentially on the base substrate;

the film layers in the first bonding region include a first gate layer, a gate insulating layer, a second gate layer, an interlayer dielectric layer, and a source and drain layer that are sequentially on the base substrate, and the film layers in the second bonding region include an interlayer dielectric layer and a source and drain layer that are sequentially on the base substrate;

the film layers in the first bonding region include a gate layer, an interlayer dielectric layer, a first source and drain layer, a planarization layer, and a second source and drain layer that are sequentially on the base substrate, and the film layers in the second bonding region include an interlayer dielectric layer and one of the first source and drain layer and the second source and drain layer that are sequentially on the base substrate;

the film layers in the first bonding region include a gate layer, an interlayer dielectric layer, a first source and drain layer, a planarization layer, and a second source and drain layer that are sequentially on the base substrate, and the film layers in the second bonding region include a gate layer, an interlayer dielectric layer and one of the first source and drain layer and the second source and drain layer that are sequentially on the base substrate;

the film layers in the first bonding region include a first gate layer, a gate insulating layer, a second gate layer, an interlayer dielectric layer, a first source and drain layer, a planarization layer, and a second source and drain layer that are sequentially on the base substrate, and the film layers in the second bonding region include a first gate layer, a gate insulating layer, and one of the first source and drain layer and a second source and drain layer that are sequentially on the base substrate;

the film layers in the first bonding region include a first gate layer, a gate insulating layer, a second gate layer, an interlayer dielectric layer, a first source and drain layer, a planarization layer, and a second source and drain layer that are sequentially on the base substrate, and the film layers in the second bonding region include a gate insulating layer and one of the first source and drain layer and the second source and drain layer that is on the base substrate that are sequentially on the base substrate;

the film layers in the first bonding region include a buffer layer, a gate layer, an interlayer dielectric layer, and a source and drain layer that are sequentially on the base substrate, and the film layers in the second bonding region include a gate layer, an interlayer dielectric layer, and a source and drain layer that are sequentially on the base substrate; and the film layers in the first bonding region include a gate layer, an interlayer dielectric layer, and a source and drain layer that are sequentially on the base substrate, and the film layers in the second bonding region include a source and drain layer on the base substrate.

Optionally, the film layers in the first bonding region and the film layers in the second bonding region respectively include a buffer layer, a gate layer, an interlayer dielectric layer, and a source and drain layer that are sequentially on the base substrate, wherein a thickness of the buffer layer in the second bonding region is less than a thickness of the buffer layer in the first bonding region.

Optionally, the flexible display substrate includes a display region and a non-display region, the first bonding region and the second bonding region are in the non-display region, and a thickness of the flexible display substrate in the display region is greater than a thickness of the flexible display substrate in the first bonding region in the direction perpendicular to the flexible display substrate.

Optionally, the film layers in the display region include an active layer, a gate insulating layer, a gate layer, an interlayer dielectric layer, a source and drain layer, a planarization layer, and an electrode layer that are sequentially on the base substrate in a stacking fashion, wherein the gate layer is a single layer structure or a double layer structure, and the source and drain layer is a single layer structure or a double layer structure.

Optionally, at least two of the m metal layers in the first bonding region are connected by a via.

Optionally, the flexible display substrate is provided with an input region and an output region that are arranged at an interval, the first bonding region is respectively arranged in the input region and the output region, and the second bonding region is arranged between the input region and the output region.

Optionally, the second bonding region is provided on two sides of the first bonding region in a direction perpendicular to an arrangement direction of the input region and the output region.

In another aspect, embodiments of the present disclosure provide a display panel. The display panel include the flexible display substrate as described above.

In still another aspect, embodiments of the present disclosure provide a display device. The display device includes the display panel as described above.

In still another aspect, embodiments of the present disclosure provide a manufacturing method of a flexible display substrate. The method includes: providing a flexible base substrate; and forming a plurality of film layers on the flexible base substrate, to obtain a flexible display substrate provided with a first bonding region and a second bonding region, wherein the first bonding region and the second bonding region are configured to be bonded to an electronic component, and a thickness of the flexible display substrate in the first bonding region is greater than a thickness of the flexible display substrate in the second bonding region in a direction perpendicular to the flexible display substrate.

Optionally, forming the plurality of film layers on the flexible base substrate includes: sequentially forming the film layers by one patterning process in a film layer order distal from the flexible base substrate.

Optionally, the first bonding region is configured as a signal transmission region between the flexible display substrate and the electronic component, and the second bonding region is configured as a non-signal transmission region between the flexible display substrate and the electronic component.

BRIEF DESCRIPTION OF THE DRAWINGS

In order to illustrate technical solutions in embodiments of the present disclosure more clearly, a brief introduction of the drawings used in the embodiments will be provided herein. Obviously, the drawings described below are merely some embodiments of the present disclosure, those skilled in the art can also obtain other drawings according to these drawings without creative work.

DETAILED DESCRIPTION

For clearer descriptions of the objectives, technical solutions, and advantages of the present disclosure, the embodiments of the present disclosure are further described below in detail with reference to the accompanying drawings.

A screen-to-body ratio is a ratio of the area of a display screen to the area of the front panel of a display device. The current development trend of OLED display devices is to increase the screen-to-body ratio. One effective way of increasing the screen-to-body ratio is bonding a driver chip to a flexible display substrate by using a chip on plastic (COP) process. In the COP process, after a driver IC is bonded to the flexible display substrate, a portion, provided with the driver IC, of the flexible display substrate is folded to the back of the flexible display substrate due to the foldable performance of the flexible display substrate, thereby improving a screen-to-body ratio.

During COP bonding, an anisotropic conductive film (ACF) needs to be disposed in a bonding region of the flexible display substrate. Then, in a heated and pressurized state, the driver IC and the corresponding bonding region on the flexible display substrate are bonded together by using an ACF adhesive. Since the hardness of the flexible display substrate is not high, deformation is prone to occurring during the bonding process, resulting in occurrence of a display device defect.

A deformation of a flexible display substrate during bonding is described below with reference to FIG. 1 and FIG. 2.

Figure 1:
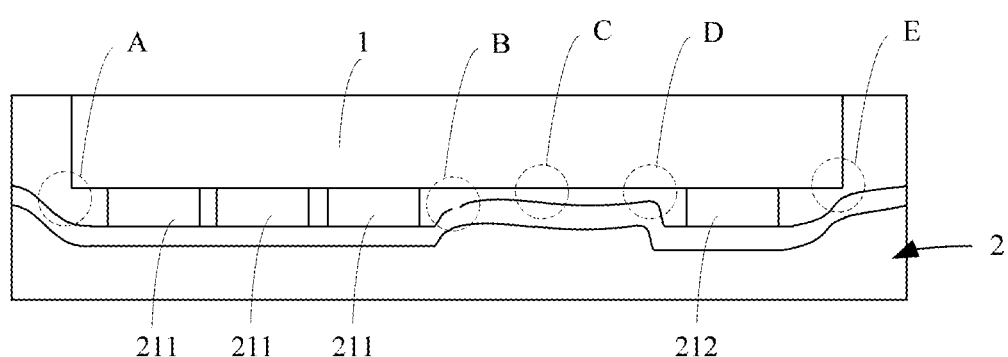
FIG. 1 is schematic diagram of a state when a flexible display substrate is bonded to a driver chip in the related art.

FIG. 1 is schematic diagram of a state when a flexible display substrate is bonded to a driver chip in the related art. As shown in FIG. 1, a flexible display substrate 2 includes a bonding region bonded to a driver chip 1 and a non-bonding region other than the region bonded to the driver chip 1. The bonding region is used for implementing signal transmission between the flexible display substrate and the driver chip 1. Transmitted signals include a signal inputted into the driver chip 1 and a signal outputted from the driver chip 1. Therefore, a partial bonding region 211 of the bonding region is used for receiving the signal transmitted by the driver chip 1 and may be arranged collectively in an input region. Another partial bonding region 212 of the bonding region is used for outputting a signal to the driver chip 1 and may be arranged collectively in an output region.

For example, three regions bonded to the driver chip 1 on the left side in FIG. 1 are the bonding regions 211 used for receiving a signal transmitted by the driver chip 1, and one region bonded to the driver chip 1 on the right side in FIG. 1 is the bonding region 212 used for outputting a signal to the driver chip 1. It can be seen from FIG. 1 that non-bonding regions are provided between and around the bonding regions 211 and the bonding region 212. In a heated and pressurized state, during the bonding of the driver chip 1, the bonding regions are recessed relative to the non-bonding regions, resulting in warp deformations (as shown by A, B, C, D, and E in FIG. 1) in the flexible display substrate 2.

Figure 2:
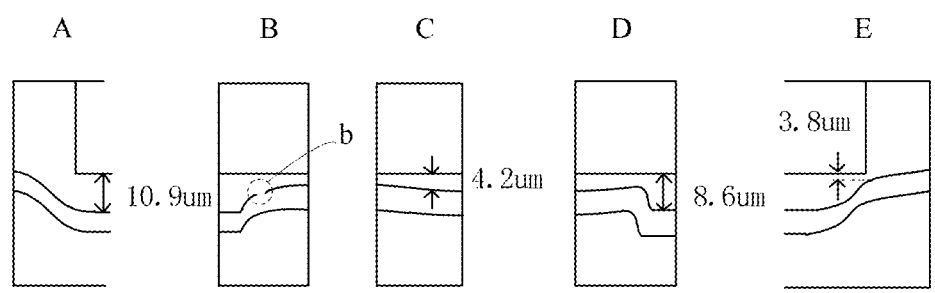
FIG. 2 is a partial schematic diagram of a plurality of deformations of the flexible display substrate in FIG. 1.

FIG. 2 is a partial schematic diagram of a plurality of deformations of the flexible display substrate in FIG. 1, and is used for showing the deformations at A, B, C, D, and E in FIG. 1 in detail. In a case that the flexible display substrate 2 does not deform, a normal distance between the flexible display substrate 2 and the driver chip 1 after bonding is 12 μm. As shown in FIG. 2, in this embodiment, a pitch between the position A of the flexible display substrate 2 and the driver chip 1 is 10.9 μm. That is, a warp deformation occurs at the position A because a bonding region of the flexible display substrate is recessed.

In another example, a pitch between the position B of the flexible display substrate 2 and the driver chip 1 is relatively small. That is, a relatively large deformation occurs at the position. As a result, a deformation occurs at the position B of the flexible display substrate 2 because of internal compressional deformation to fracture (as shown by b in FIG. 2). In this way, a signal trace in the flexible display substrate 2 is broken to affect the normal use.

In still another example, a pitch between the position C of the flexible display substrate 2 and the driver chip 1 is 4.2 μm. That is, a relatively large deformation occurs at the position. The position is relatively close to the driver chip 1 and prone to short circuit the driver chip 1. In addition, a pitch between the position D of the flexible display substrate 2 and the driver chip 1 is 8.6 μm. The position is relatively close to the driver chip and also prone to short circuit the driver chip 1. Similarly, a pitch between the position E of the flexible display substrate 2 and the driver chip 1 is 3.8 μm. The location is very close to a corner location of the driver chip 1, and also prone to short circuit the driver chip 1.

It can be seen from FIG. 1 and FIG. 2, the flexible display substrate 2 deforms during bonding to easily cause the following problems:

(1) A cell test (CT, a panel function test) circuit unit is usually disposed in a non-bonding region between the input region and the output region on the flexible display substrate 2, and the CT circuit unit is disposed between the flexible display substrate 2 and the driver chip 1. The flexible display substrate 2 deforms to damage the CT circuit unit.

(2) After the flexible display substrate 2 deforms, a position that requires bonding to the driver chip 1 on the flexible display substrate 2 may fail to be adequately bonded and fixed to the driver chip 1. In addition, excessive deformation of the flexible display substrate 2 may also easily cause the flexible display substrate 2 to break (referring to B in FIG. 1), which may cause the signal trace in the flexible display substrate 2 to be broken.

(3) The driver chip 1 is usually bonded and fixed with the flexible display substrate 2 by using an anisotropic conductive film (ACF) adhesive. Because gold ball particles in the ACF adhesive has a conductive effect, when the flexible display substrate 2 deforms excessively, the ACF adhesive accumulates in the input region and the output region. The accumulation of the gold ball particles can easily cause adjacent bonding regions 211 in the input region and adjacent bonding regions 212 in the output region to be directly conductive and electrically connected, thereby leading to signal short circuits.

An embodiment of the present disclosure provides a flexible display substrate, such that a deformation of the flexible display substrate can be reduced during the bonding of a driver chip and the flexible display substrate.

Figure 3:
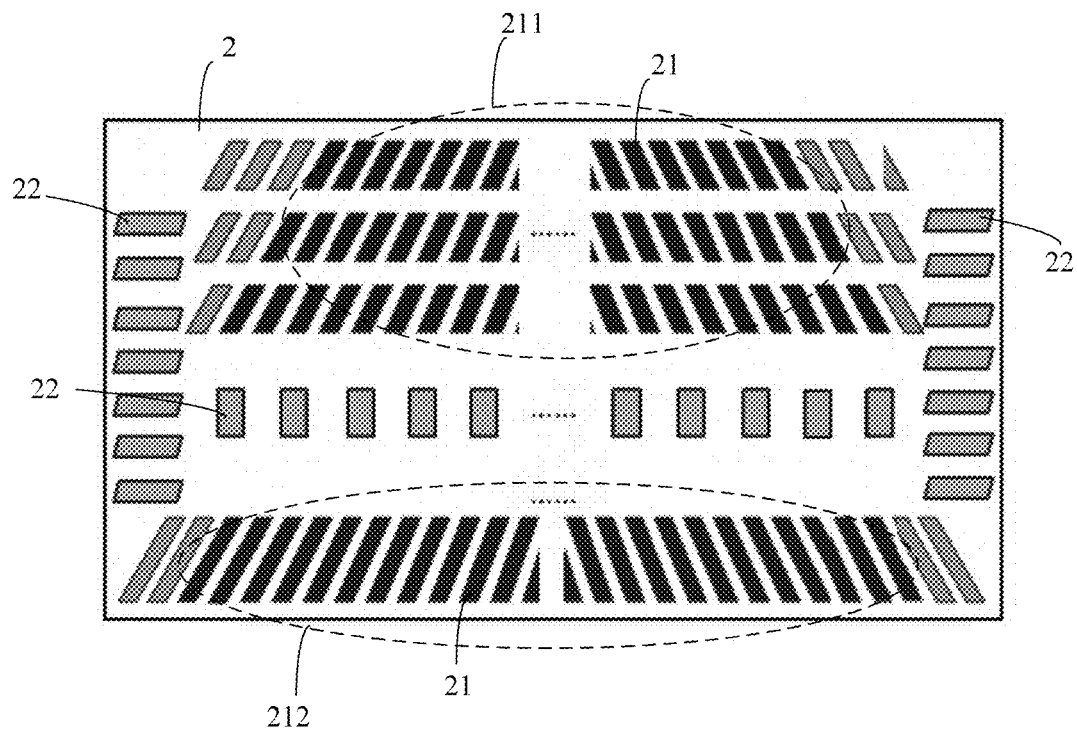
FIG. 3 is a partial schematic structural diagram of a flexible display substrate according to an embodiment of the present disclosure.

FIG. 3 is a schematic structural diagram of a flexible display substrate according to an embodiment of the present disclosure. As shown in FIG. 3, the flexible display substrate 2 is provided with a first bonding region 21 and a second bonding region 22. The first bonding region 21 is used for being bonded to an electronic component (for example, a driver chip) and performs signal transmission with the electronic component. The second bonding region 22 is used for being bonded to an electronic component but does not perform signal transmission.

That is, in this embodiment of the present disclosure, the first bonding region 21 and the second bonding region 22 are configured to be bonded to one electronic component 1. The first bonding region 21 is used for being bonded to an electronic component and performs signal transmission with the electronic component, which means that the first bonding region 21 is configured as a signal transmission region (also referred to as an electrical connection region) between the flexible display substrate 2 and the electronic component. The second bonding region 22 is used for being bonded to an electronic component but does not perform signal transmission, which means that the second bonding region 22 is configured as a non-signal transmission region (also referred to as a non-electrical connection region) between the flexible display substrate 2 and the electronic component.

Figure 4:
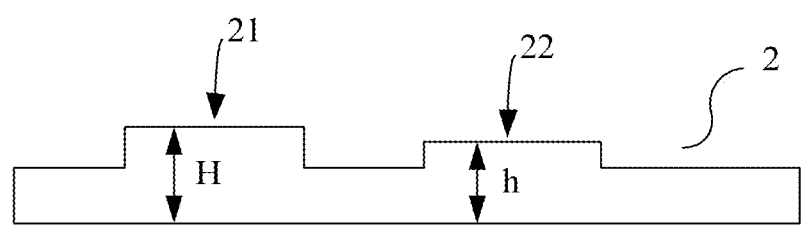
FIG. 4 is a schematic structural side view of a flexible display substrate according to an embodiment of the present disclosure.

FIG. 4 is a schematic structural side view of a flexible display substrate according to an embodiment of the present disclosure, exemplarily showing a thickness relationship between the first bonding region and the second bonding region of the flexible display substrate. As shown in FIG. 4, a thickness H of the flexible display substrate 2 in the first bonding region 21 is greater than a thickness h of the flexible display substrate 2 in the second bonding region 22 in a direction perpendicular to the flexible display substrate 2.

The flexible display substrate provided in this embodiment of the present disclosure includes the first bonding region that performs signal transmission with an electronic component and the second bonding region that does not perform signal transmission with an electronic component, and the thickness of the flexible display substrate in the first bonding region is greater than the thickness of the flexible display substrate in the second bonding region, such that after the flexible display substrate is placed horizontally, the first bonding region is higher than the second bonding region. During the bonding of the electronic component, the first bonding region is bonded to the electronic component prior to the second bonding region. After the first bonding region has been bonded to the electronic component, the second bonding region whose thickness is less than the thickness of the first bonding region contacts the electronic component due to deformation and recesses of the flexible display substrate, the second bonding region can achieve a support effect and increase the contact area between the flexible display substrate and the electronic component, thereby reducing further deformations of the flexible display substrate and improving the yield of a bonding process. In addition, the first bonding region is connected and bonded to the electronic component prior to the second bonding region, such that the bonding effect between the first bonding region and the electronic component can further be ensured.

Exemplarily, the first bonding region may be electrically connected to the signal trace on the flexible display substrate, to enable the first bonding region to be perform signal transmission with a flexible circuit board. The second bonding region may be not electrically connected to the signal trace on the flexible display substrate, to shield the second bonding region to prevent the second bonding region from performing signal transmission.

In this embodiment of the present disclosure, both the first bonding region and the second bonding region refer to the region where pads are located. A pad in the first bonding region is referred to as a first pad. An orthographic projection of the first pad on a base substrate overlaps the first bonding region or the first bonding region is a region formed by the outer contour of the orthographic projection of the first pad on the base substrate extending outward by a particular range. The first pad is electrically connected to the signal trace, such that signal transmission between the flexible display substrate and the electronic component can be implemented by using the first bonding region. A pad in the second bonding region is referred to as a second pad. An orthographic projection of the second pad on the base substrate overlaps the second bonding region or the second bonding region is a region formed by the outer contour of the orthographic projection of the second pad on the base substrate extending outward by a particular range. The second pad is electrically connected to the signal trace, such that signal transmission between the flexible display substrate and the electronic component can be implemented by using the second bonding region.

Alternatively, the first bonding region and the second bonding region may both be electrically connected to the signal trace on the flexible display substrate. The first bonding region may be bonded to an effective bump on an electronic component, and the second bonding region may be bonded to an ineffective bump on the electronic component. The effective bump is electrically connected to a signal trace on the electronic component, such that the signal transmission between the flexible display substrate and the electronic component can be implemented by using the first bonding region, and the ineffective bump is not electrically connected to the signal trace on the electronic component, such that the signal transmission between the flexible display substrate and the electronic component cannot be implemented by using the second bonding region.

There may be many types of electronic components suitable for the present disclosure. For example, the electronic component may be a device such as a driver chip, a touch chip or a flexible circuit board. After being bonded to the flexible display substrate, the driver chip may be used for controlling a display region of the flexible display substrate to emit light. After being bonded to the flexible display substrate, a touch chip may be electrically connected to a touch electrode disposed in the display region of the flexible display substrate, receive a touch signal, and implement a touch function of the touch chip. The flexible circuit board may be bonded to the flexible display substrate and configured to connect the flexible display substrate to an external controller, to implement the signal transmission between the external controller and the flexible display substrate.

Only the driver chip is used as an example to describe the flexible display substrate in detail in the following embodiments.

In some embodiments of the present disclosure, the driver chip 1 is provided with a first bump and a second bump. The first bump is used for being bonded to the first bonding region 21 on the flexible display substrate 2. The second bump is used for being bonded to the second bonding region 22 on the flexible display substrate 2.

Optionally, the flexible display substrate is provided with a plurality of first bonding regions and a plurality of second bonding regions. For example, part of the plurality of first bonding regions may be used for receiving a signal transmitted by the driver chip. These bonding regions may be arranged collectively in an input region. The other of the plurality of first bonding regions may transmit a signal to the driver chip. These bonding regions may be arranged collectively in an output region. The input region and the output region may be arranged at an interval on the flexible display substrate.

FIG. 3 is a partial schematic structural side view of a flexible display substrate according to an embodiment of the present disclosure, showing the relative positions of the first bonding region and the second bonding region. As shown in FIG. 3, the flexible display substrate 2 includes an input region 211 and an output region 212 that are arranged at an interval. The input region 211 and the output region 212 are respectively provided with a plurality of first bonding regions 21.

Herein, both the input region 211 and the output region 212 are regions that are bonded to and perform signal transmission with the driver chip 1. During working, the flexible display substrate 2 first receives a control signal sent by a control device, and transmit the control signal to the driver chip 1 by using the output region 212 to for further processing. After the processing is completed, the driver chip 1 transmits a signal to the flexible display substrate 2 by using the input region 211, and transmits the signal to a display region by using a signal line, connected to the first bonding region 21 in the input region 211, on the flexible display substrate 2, thereby implementing the display work of a display device.

Exemplarily, as shown in FIG. 3, the second bonding region 22 is provided between the input region 211 and the output region 212. During bonding, after the flexible display substrate 2 deforms and then touches and is bonded to the driver chip 1 by the second bonding region 22 between the input region 211 and the output region 212, such that it can be avoided that during the crimping and bonding of the driver chip 1, the flexible display substrate 2 dents and deforms excessively because there is an excessively large pitch and no support between the input region 211 and the output region 212.

Optionally, as shown in FIG. 3, the periphery of the input region 211 and the output region 212 are also provided with the second bonding region 22. The deformation of the flexible display substrate may further be reduced during bonding by providing the second bonding region 22 from the periphery of the input region 211 and the output region 212.

Exemplarily, as shown in FIG. 3, the second bonding region 22 is disposed on two sides of the first bonding region 21 in a direction perpendicular to an arrangement direction of the input region 211 and the output region 212. The second bonding region 22 is distributed on two sides of the first bonding region 21, such that when deforming during crimping and bonding, the flexible display substrate 2 may contact and bond with the driver chip 1 by the second bonding region 22, to increase the contact area between the driver chip 1 and the flexible display substrate 2, thereby preventing the flexible display substrate 2 from further deformations. In this way, after the flexible display substrate 2 and the driver chip 1 are bonded, the corner position of the driver chip 1 is prevented from directly contacting the flexible display substrate 2, such that a short circuit is avoided.

It needs to be noted that in other embodiments, the second bonding region 22 may be disposed only between the input region 211 and the output region 212 or only at the periphery of the input region 211 and the output region 212. In addition, when the second bonding region 22 is disposed at the periphery of the input region 211 and the output region 212, the position of the second bonding region 22 relative to the first bonding region 21 may be adjusted according to an actual requirement. Besides, the number of first bonding regions 21 and the number of second bonding regions 22 in FIG. 3 are only examples, which is not limited in the present disclosure.

Exemplarily, in the embodiment shown in FIG. 3, each of the first bonding region 21 and the second bonding region 22 is in a rectangular shape, which is not limited in the embodiment of the present disclosure. For example, the first bonding region and the second bonding region may have various shapes such as a triangular shape or a quadrilateral shape, and may be set according to an actual requirement.

Figure 5:
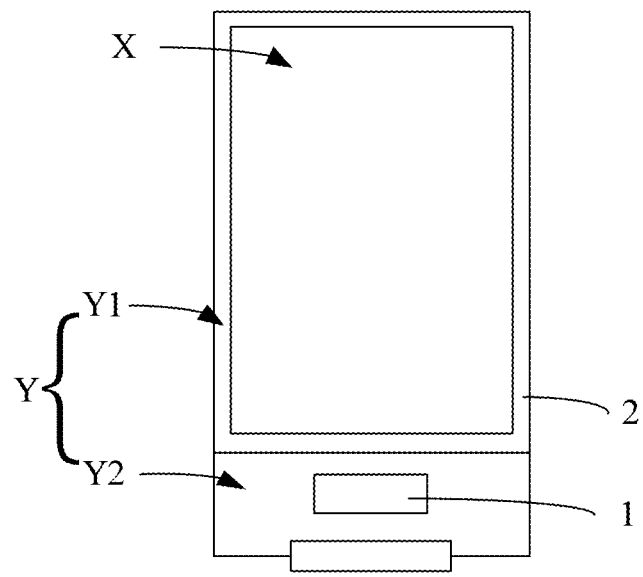
FIG. 5 is a schematic structural diagram of a flexible display substrate to which a driver chip is connected according to an embodiment of the present disclosure.

FIG. 5 is a schematic structural diagram of a flexible display substrate to which a driver chip is connected according to an embodiment of the present disclosure. As shown in FIG. 5, the flexible display substrate 2 usually includes a display region X and a non-display region Y around the display region X. The non-display region Y may include a first non-display region Y1 around the display region X and a second non-display region Y2 used for bonding the driver chip 1 and a bonding region is disposed in the second non-display region Y2.

The first non-display region Y1 is usually used for arranging a signal trace to connect circuit structure in the display region X and the bonding region, such that the driver chip 1 can transmit a processed signal to the display region X by using the signal trace. Exemplarily, the circuit structure in the display region X may be a gate line, a data line or the like. Correspondingly, the signal trace may be a trace used for transmitting a gate signal, a trace used for transmitting a data signal or the like.

Optionally, a thickness of a region other than the first bonding region and the second bonding region in the second non-display region Y2 is less than a thickness of the first bonding region and the second bonding region. That is, when the flexible display substrate is placed in a plane, the first bonding region and the second bonding region are higher than a region other than the first bonding region and the second bonding region in the second non-display region Y2 in the direction perpendicular to the flexible display substrate. Therefore, the first bonding region and the second bonding region may also be referred to as bonding bumps. A thickness of the region of the first non-display region Y1 may be greater than, equal to or less than the thickness of the first bonding region and the second bonding region.

Figure 6:
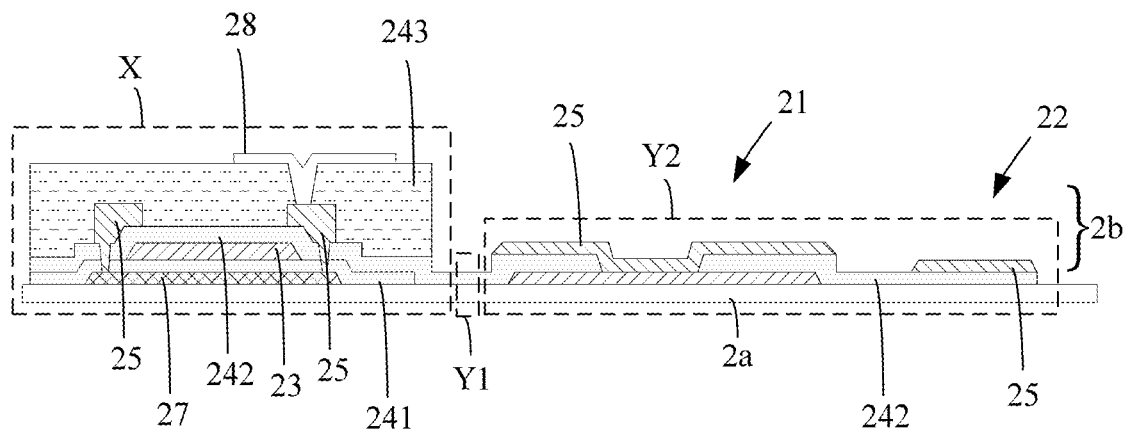
FIG. 6 is a schematic structural partial sectional view of a flexible display substrate according to an embodiment of the present disclosure.

Exemplarily, FIG. 6 is a schematic structural sectional view of a flexible display substrate according to an embodiment of the present disclosure. As shown in FIG. 6, both the first bonding region 21 and the second bonding region 22 are higher than a non-bonding region disposed in the second non-display region Y2 and higher than the first non-display region Y1 around the display region X.

Exemplarily, continuing to refer to FIG. 6, the flexible display substrate 2 includes a flexible base substrate 2*a* and a plurality of film layers 2*b* on the flexible base substrate 2*a*. Exemplarily, the flexible base substrate 2*a* may be a polyimide (PI) substrate. The plurality of film layers 2*b* in the display region may include various film layer structures such as a gate layer, an interlayer dielectric layer, a source and drain layer, a planarization layer, and an electrode layer.

In practice, the number of film layers in the display region is usually greater than the number of film layers in the non-display region. In addition, the film layers in the non-display region are usually a part of the film layers in the display region. That is, the film layers in the non-display region and the corresponding film layers in the display region are usually disposed in the same layer. Herein, the same layer may be that the film layers are formed in one patterning process or may be that the film layers are disposed on one same side of one same layer or may be that the surfaces, close to the surface of the base substrate, of the film layers contact with one same layer. Exemplarily, as shown in FIG. 6, an interlayer dielectric layer 242 in the display region X and an interlayer dielectric layer 242 in the non-display region Y are in the same layer. Herein, the interlayer dielectric layer 242 in the display region X and the interlayer dielectric layer 242 in the non-display region Y may also be considered as different parts of the same film layer.

The layer structure of the flexible display substrate in this embodiment of the present disclosure are described below with reference to FIG. 6.

As shown in FIG. 6, in the display region X, one active layer 27 is provided on the flexible base substrate 2*a*, one gate insulating layer 241 is provided on the active layer 27, and the gate insulating layer 241 covers the active layer 27. One gate layer 23 is provided on the gate insulating layer 241, and one interlayer dielectric layer 242 is provided on the gate layer 23. A source and drain layer 25 is provided on the interlayer dielectric layer 242, the interlayer dielectric layer 242 is provided with a via, and the active layer 27 is connected to the source and drain layer 25 by the via. To planarize the flexible display substrate, one planarization layer 243 may be provided on the source and drain layer 25. The gate layer 23, the gate insulating layer 241, the active layer 27, the interlayer dielectric layer 242, and the source and drain layer 25 together form a thin film transistor (TFT). In addition, in the display region X, an electrode layer 28 is provided on a planarization layer 262, the planarization layer 262 is provided with a via, and the electrode layer 28 is connected to the source and drain layer 25 by the via.

Optionally, the flexible display substrate may be an OLED display substrate or may be a liquid crystal display (LCD) display substrate. When the flexible display substrate is an OLED display substrate, the electrode layer 28 may be an anode layer. Correspondingly, the OLED display substrate further includes a light-emitting layer, a cathode layer, a pixel defining layer, and the like. The light-emitting layer and the cathode layer are sequentially disposed on the anode layer. The pixel defining layer may be disposed on the planarization layer. In addition, a plurality of photo spacers (PSs) may further be disposed at intervals on the pixel defining layer. The PSs may achieve a support effect in the flexible display substrate, to protect OLEDs from being compressed. When the flexible display substrate is an LCD display substrate, the electrode layer 28 may be a pixel electrode layer.

It needs to be noted that in the display region X, a plurality of pixel units are usually provided. Each of the pixel units includes at least one subpixel unit, for example, a red subpixel unit, a blue subpixel unit, and a green subpixel unit. FIG. 6 only shows an exemplary layer structure of one subpixel unit, but this is not used to limit the layer structure of the flexible display substrate in the present disclosure.

For example, in the foregoing example, a single-gate layer structure is used in the film layer structure of the display region. In some embodiments of the present disclosure, a double-gate layer structure may be alternatively used in the film layer structure of the display region. A difference from the single-gate layer structure is that the double-gate layer structure is provided with two gate layers (that is, including one first gate layer and one second gate layer). Another gate insulating layer is provided between the first gate layer and the second gate layer to isolate the first gate layer from the second gate layer. In addition, a single source and drain layer structure is used in the film layer structure of the display region. In other embodiments, a double source and drain layer structure may be alternatively used.

As shown in FIG. 6, a thickness of the first bonding region 21 is greater than a thickness of the second bonding region 22 in the direction perpendicular to the flexible display substrate. Optionally, a thickness difference may exist between the first bonding region 21 and the second bonding region 22 by controlling a number relationship and a thickness relationship of the film layers of the first bonding region 21 and the second bonding region 22.

In some embodiments, the number of film layers 2*b* in the first bonding region 21 is greater than or equal to the number of film layers 2*b* in the second bonding region 22. When the number of film layers in the first bonding region 21 is greater than the number of film layers in the second bonding region 22, the thickness of the film layers 2*b* in the second bonding region 22 may be controlled to be equal to part of film layers 2*b* in the first bonding region 21. Therefore, with more film layers 2*b* in the first bonding region 21 than the second bonding region 22, it can be ensured that the thickness of the first bonding region 21 is greater than the thickness of the second bonding region 22. Alternatively, when the number of film layers in the first bonding region 21 is equal to the number of film layers in the second bonding region 22, the thickness a part of the film layers 2*b* in the second bonding region 22 may also be controlled to be less than the thickness of the corresponding film layers 2*b* in the first bonding region 21, to ensure that the thickness of the first bonding region 21 is greater than the thickness of the second bonding region 22.

Optionally, the film layers 2*b* in the second bonding region 22 and at least part of the film layers 2*b* in the first bonding region 21 may be in the same layer. That is, the number of film layers in the second bonding region 22 is less than or equal to the number of film layers in the first bonding region, and for each film layer in the second bonding region 22, the corresponding film layers exist in the first bonding region 21. Herein, the film layers in the same layer may be film layers formed by one patterning process. That is, because the corresponding film layers 2*b* in the first bonding region 21 and the film layers 2*b* in the second bonding region 22 are in the same layer, during the formation of the film layers 2*b* in the second bonding region 22, part of film layers 2*b* in the first bonding region 21 may be formed at the same time, to improve the efficiency of manufacturing a flexible display substrate. In addition, the film layers 2*b* in the first bonding region 21 may further be in the same layer with the film layers in the display region, to further simplify a manufacturing process.

In some embodiments, when the number of film layers 2b in the first bonding region 21 is greater than the number of film layers 2b in the second bonding region 22, a thickness of the film layers 2b in the first bonding region is equal to a thickness of the film layers 2b that are located in the same layer in the second bonding region 22. Because there are more film layers 2b in the first bonding region 21 than in the second bonding region 22, and the thickness of the film layers 2b in the first bonding region 21 is equal to the film layers that are located in the same layer in the second bonding region 22, it can be ensured that the thickness of the first bonding region 21 is greater than the thickness of the second bonding region 22.

In some embodiments, when the number of film layers 2b in the first bonding region 21 is greater than or equal to the number of film layers 2b in the second bonding region 22, and for the film layers 2b located in the same layer in the first bonding region 21 and the second bonding region 22, a thickness of the at least part of the film layers 2b in the second bonding region 22 is less than a thickness of the corresponding film layer 2b in the first bonding region 21.

Optionally, the film layers in the first bonding region may include m metal layers and x non-metal layers, the film layers in the second bonding region include n metal layers and y non-metal layers, wherein m and n are positive integers, m≥n, x and y are integers not less than 0, and x≥y.

An uppermost metal layer located in the first bonding region is a first pad, and the uppermost metal layer located in the second bonding region is a second pad. The uppermost metal layer located in the first bonding region is a metal layer that is farthest away from the flexible base substrate of the flexible display substrate in the direction perpendicular to the flexible display substrate.

That is, the number relationship between the film layers in the first bonding region and the film layers in the second bonding region may include the following four types:

In a first type, the number of metal layers in the first bonding region is greater than the number of metal layers in the second bonding region, and the number of non-metal layers in the first bonding region is greater than the number of non-metal layers in the second bonding region, that is, m>n, and x>y.

In a second type, the number of metal layers in the first bonding region is greater than the number of metal layers in the second bonding region, and the number of non-metal layers in the first bonding region is equal to the number of non-metal layers in the second bonding region, that is, m>n, and x=y.

In a third type, the number of metal layers in the first bonding region is equal to the number of metal layers in the second bonding region, and the number of non-metal layers in the first bonding region is greater than the number of non-metal layers in the second bonding region, that is, m=n, and x>y.

In a fourth type, the number of metal layers in the first bonding region is equal to the number of metal layers in the second bonding region, and the number of non-metal layers in the first bonding region is equal to the number of non-metal layers in the second bonding region, that is, m=n, and x=y.

For the first type to the third type, the thickness of the metal layers in the second bonding region is equal to the thickness of the corresponding metal layers in the first bonding region. The thickness of the non-metal layers in the second bonding region may be less than or equal to the thickness of the corresponding non-metal layers in the first bonding region. For the fourth type, the thickness of the metal layers in the second bonding region is equal to the thickness of the corresponding metal layers in the first bonding region, and the thickness of the non-metal layers in the second bonding region is less than the thickness of the corresponding non-metal layers in the first bonding region.

Exemplarily, when the number relationship between the film layers in the first bonding region and the film layers in the second bonding region is the first type, the film layers in the first bonding region and the second bonding region may be arranged according to any of the following configurations:

According to a configuration of this embodiment, the m metal layers in the first bonding region include a first gate layer, a second gate layer, and a source and drain layer, and the n metal layers in the second bonding region are source and drain layers. That is, the m metal layers in the first bonding region are three metal layers, and the n metal layers in the second bonding region are one metal layer. In addition, the film layers in the first bonding region further include two non-metal layers, and the film layers in the second bonding region further include one non-metal layer. That is, the x non-metal layers in the first bonding region are two layers, and the y non-metal layers in the second bonding region are defined to one layer.

Figure 7:
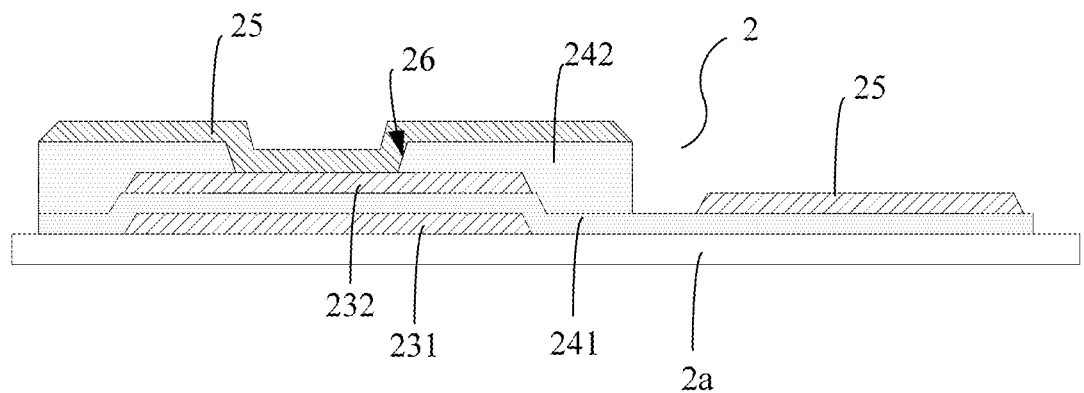
FIG. 7 is a schematic structural diagram of a flexible display substrate according to an embodiment of the present disclosure.

FIG. 7 is a schematic structural diagram of a flexible display substrate according to an embodiment of the present disclosure. As shown in FIG. 7, the film layers in the first bonding region 21 include three metal layers (one first gate layer 231, one second gate layer 232, and one source and drain layer 25). The film layers in the second bonding region 22 include one metal layer (the source and drain layer 25). In addition, the film layers in the first bonding region further include two non-metal layers (one gate insulating layer 241 and one interlayer dielectric layer 242), and the film layers in the second bonding region further include one non-metal layer (one gate insulating layer 241).

According to another configuration of this embodiment, the m metal layers in the first bonding region include a gate layer, a first source and drain layer, and a second source and drain layer. The n metal layers in the second bonding region is one of a first source and drain layer and a second source and drain layer. That is, the m metal layers in the first bonding region are three metal layers, and the n metal layers in the second bonding region is one metal layer. In addition, the film layers in the first bonding region further include two non-metal layers, and the film layers in the second bonding region further include one non-metal layer. That is, the x non-metal layers in the first bonding region are two layers, and the y non-metal layers in the second bonding region are defined to one layer.

Figure 8:
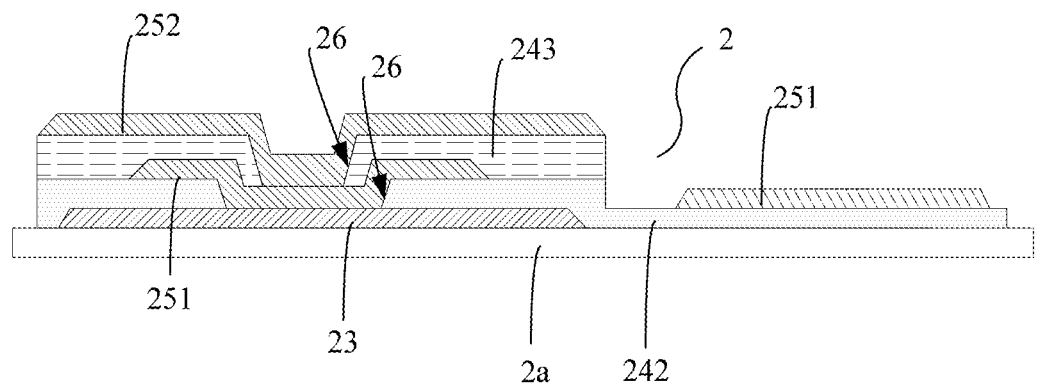
FIG. 8 is a schematic structural diagram of a flexible display substrate according to an embodiment of the present disclosure.

FIG. 8 is a schematic diagram of a flexible display substrate according to an embodiment of the present disclosure. As shown in FIG. 8, the film layers in the first bonding region 21 include three metal layers (one gate layer 23, one first source and drain layer 251, and one second source and drain layer 252). The film layers in the second bonding region 22 include one metal layer (one first source and drain layer 251). In addition, the film layers in the first bonding region 21 further include one interlayer dielectric layer 242 and one planarization layer 243. The film layers in the second bonding region 22 further include one interlayer dielectric layer 242.

In some embodiments, the m metal layers in the first bonding region include a first gate layer, a second gate layer, a first source and drain layer, and a second source and drain layer. The n metal layers in the second bonding region include one of a first gate layer and a second gate layer and one of the first source and drain layer and the second source and drain layer. That is, the m metal layers in the first bonding region are four metal layers, and the n metal layers in the second bonding region are two metal layers. In addition, the film layers in the first bonding region further include three non-metal layers, and the film layers in the second bonding region further include one non-metal layer. That is, the x non-metal layers in the first bonding region are three layers, and the y non-metal layers in the second bonding region are defined one layer.

Figure 9:
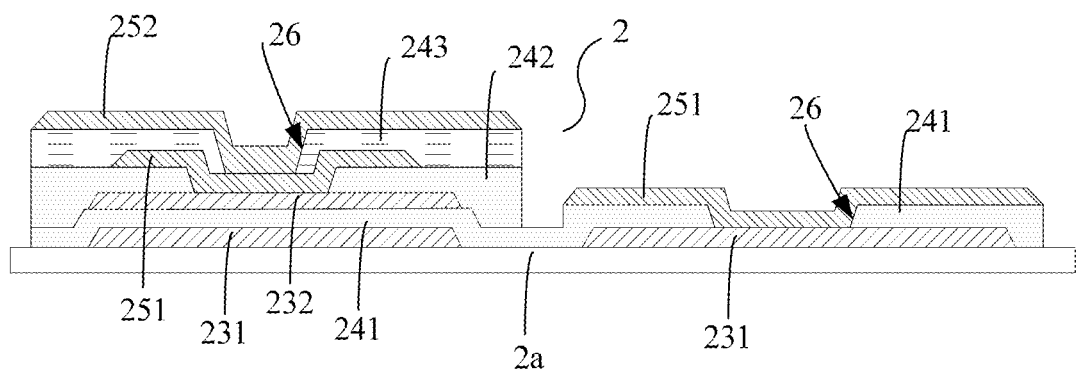
FIG. 9 is a schematic structural diagram of a flexible display substrate according to an embodiment of the present disclosure.

FIG. 9 is a schematic structural diagram of a flexible display substrate according to an embodiment of the present disclosure. As shown in FIG. 9, the film layers in the first bonding region 21 include four metal layers (one first gate layer 231, one second gate layer 232, one first source and drain layer 251, and one second source and drain layer 252). The film layers in the second bonding region 22 include two metal layers (one first gate layer 231 and one first source and drain layer 251). In addition, the film layers in the first bonding region 21 further include three non-metal layers (one gate insulating layer 241, one interlayer dielectric layer 242, and one planarization layer 243). The film layers in the second bonding region 22 further include one non-metal layer (one gate insulating layer 241).

According to still another configuration of this embodiment, the film layers in the first bonding region include a gate layer, an interlayer dielectric layer, a first source and drain layer, a planarization layer, and a second source and drain layer that are sequentially located on the base substrate, and the film layers in the second bonding region include a gate layer, an interlayer dielectric layer and one of the first source and drain layer and the second source and drain layer that are sequentially located on the base substrate. That is, the m metal layers in the first bonding region include a gate layer, a first source and drain layer, and a second source and drain layer, and the n metal layers in the second bonding region include a gate layer and one of the first source and drain layer and the second source and drain layer. That is, m=3, and n=2. In addition, the film layers in the first bonding region further include two non-metal layers (one interlayer dielectric layer and one planarization layer), and the film layers in the second bonding region further include one non-metal layer (one interlayer dielectric layer). That is, x=2, and y=1.

According to still another configuration of this embodiment, the film layers in the first bonding region include a first gate layer, a gate insulating layer, a second gate layer, an interlayer dielectric layer, a first source and drain layer, a planarization layer, and a second source and drain layer that are sequentially located on the base substrate, and the film layers in the second bonding region include a gate insulating layer and one of a first source and drain layer and a second source and drain layer that is on the base substrate that are sequentially located on the base substrate. That is, the m metal layers in the first bonding region include a first gate layer, a second gate layer, a first source and drain layer, and a second source and drain layer, and the n metal layers in the second bonding region include one of the first source and drain layer and the second source and drain layer. That is, m=4, and n=1. In addition, the film layers in the first bonding region further include three non-metal layers (one gate insulating layer, one interlayer dielectric layer, and one planarization layer), and the film layers in the second bonding region further include one non-metal layer (gate insulating layer). That is, x=3, and y=1.

It needs to be noted that the film layers in the flexible display substrate 2 may usually include various film layers such as a gate layer, an interlayer dielectric layer, a source and drain layer, a planarization layer, an electrode layer. The above embodiments only take one or more of the film layers as an example, and the description is made on the fact that the number of metal layers of film layers in the first bonding region 21 is greater than the number of metal layers of the film layers in the second bonding region 22. Film layers that are not mentioned may also be used as the film layers for forming the first bonding region and the second bonding region of the flexible display substrate, which is not limited in this embodiment of the present disclosure.

In the foregoing first type, the number of metal layers in the first bonding region is larger than the number of metal layers in the second bonding region. In addition, the number of non-metal layers in the first bonding region is also larger than the number of non-metal layers in the second bonding region, such that the thickness of the first bonding region is also greater than the thickness of the second bonding region. Patterns of the each of the metal layers and each of the non-metal layers are changed by performing patterning on each of the metal layers and each of the non-metal layers. In this embodiment, no process steps need to be added, and the practice is simple and convenient.

Exemplarily, when the number relationship between the film layers in the first bonding region and the film layers in the second bonding region is the second type, the film layers in the first bonding region and the second bonding region may be arranged in the following fashion:

According to a configuration of this embodiment, the m metal layers in the first bonding region may include a gate layer and a source and drain layer, and the n metal layers in the second bonding region may be source and drain layers. That is, the m metal layers in the first bonding region are two metal layers, and the n metal layers in the second bonding region are one metal layer. In addition, the film layers in the first bonding region and the second bonding region both further include one non-metal layer. That is, the x non-metal layers in the first bonding region are defined to one layer, and the y non-metal layers in the second bonding region are defined to one layer.

Figure 10:
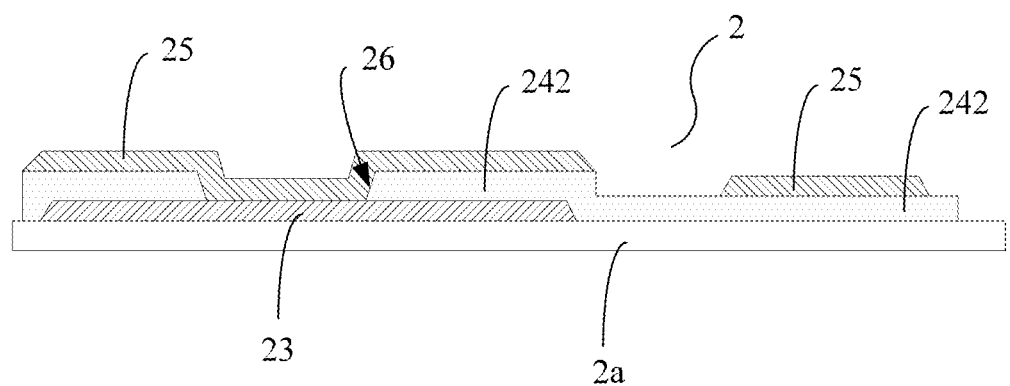
FIG. 10 is a schematic structural diagram of a flexible display substrate according to an embodiment of the present disclosure.

FIG. 10 is a schematic structural diagram of a flexible display substrate according to an embodiment of the present disclosure. As shown in FIG. 10, the film layers in the first bonding region 21 include two metal layers, and in a direction away from the base substrate, the first metal layer in the film layers in the first bonding region 21 is a gate layer 23, and the second metal layer is a source and drain layer 25. The film layers in the second bonding region 22 include one metal layer, and one metal layer in the film layers in the second bonding region 22 is the source and drain layer 25. In addition, the film layers in the first bonding region 21 and the film layers the second bonding region 22 further includes one non-metal layer, and the non-metal layer may be an interlayer dielectric layer 242.

According to another configuration of this embodiment, the first bonding region and the second bonding region may further include only a metal layer. The number of metal layers in the first bonding region may be greater than the number of metal layers in the second bonding region. The thickness of the metal layers in the first bonding region is the same as the thickness of the metal layers that are located in the same layer in the second bonding region. In a case that the number of metal layers in the first bonding region 21 is greater than the number of metal layers in the second bonding region 22, the thickness of the metal layers in the first bonding region 21 is greater than the thickness of the metal layers in the second bonding region 22.

Herein, the corresponding metal layers in the first bonding region 21 and the second bonding region 22 may both be formed by one patterning process.

In the second type, the number of metal layers in the first bonding region is greater than the number of metal layers in the second bonding region, such that the thickness of the first bonding region is greater than the thickness of the second bonding region. Patterns of each of the metal layers are changed by only performing patterning on each of the metal layers. In this embodiment, no process steps need to be added, and the practice is simple and convenient.

Exemplarily, when the number relationship between the film layers in the first bonding region and the film layers in the second bonding region is the third type, the film layers in the first bonding region 21 may include at least one metal layer and at least one non-metal layer, the film layers in the second bonding region 22 may include at least one metal layer and at least one non-metal layer, or the film layers in the second bonding region 22 may include at least one metal layer but does not include a non-metal layer, as long as the number of metal layers in the first bonding region 21 is equal to the number of metal layers in the second bonding region 22, and the number of non-metal layers in the first bonding region 21 is greater than the number of non-metal layers in the second bonding region 22.

Optionally, the metal layers in the first bonding region 21 and the second bonding region 22 may both be formed by one patterning process. The metal layers in the first bonding region 21 and the second bonding region 22 may be metal layers (for example, a gate layer and a source and drain layer) of the same type. For the metal layers of the same type, the metal layers formed by one patterning process may have consistent thickness. Therefore, in a case that the number of metal layers in the first bonding region 21 is equal to the number of metal layers in the second bonding region 22, the thickness of the metal layers in the first bonding region 21 is equal to the thickness of the metal layers in the second bonding region 22. In addition, the non-metal layers in the first bonding region 21 and the second bonding region 22 may also be formed by one patterning process. The non-metal layers in the first bonding region 21 and the second bonding region 22 may be non-metal layers (for example, gate insulating layers) of the same type. For the non-metal layers of the same type, the metal layers formed by one patterning process may have a consistent thickness. Therefore, in a case that the number of non-metal layers in the first bonding region 21 is greater than the number of non-metal layers in the second bonding region 22, the thickness of the non-metal layers in the first bonding region 21 is greater than the thickness of the non-metal layers in the second bonding region 22, and the thickness of the first bonding region 21 and the thickness of the second bonding region 22 are both equal to a thickness sum of the included metal layers and non-metal layers. Therefore, the thickness of the first bonding region 21 is definitely greater than the thickness of the second bonding region 22.

Figure 11:
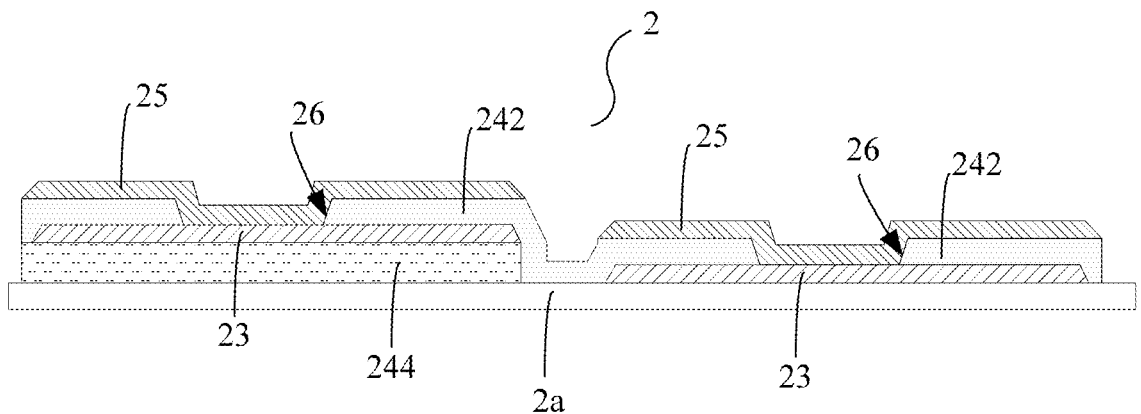
FIG. 11 is a schematic structural diagram of a flexible display substrate according to an embodiment of the present disclosure.

Exemplarily, FIG. 11 is a schematic diagram of a flexible display substrate according to an embodiment of the present disclosure. As shown in FIG. 11, the film layers in the first bonding region 21 include one source and drain layer 25 and one gate layer 23. An interlayer dielectric layer 242 is provided between the source and drain layer 25 and the gate layer 23, and a buffer layer 244 is provided between the gate layer 23 and the flexible display substrate 2. The film layers in the second bonding region 22 include one source and drain layer 25 and one gate layer 23. An interlayer dielectric layer 242 is provided between the source and drain layer 25 and the gate layer 23. It can be known from FIG. 11, the number of non-metal layers (the interlayer dielectric layer and the buffer layer) in the first bonding region 21 is greater than the number of non-metal layers (the interlayer dielectric layer) in the second bonding region 22, to enable the thickness of the first bonding region 21 to be greater than the second bonding region 22.

Figure 12:
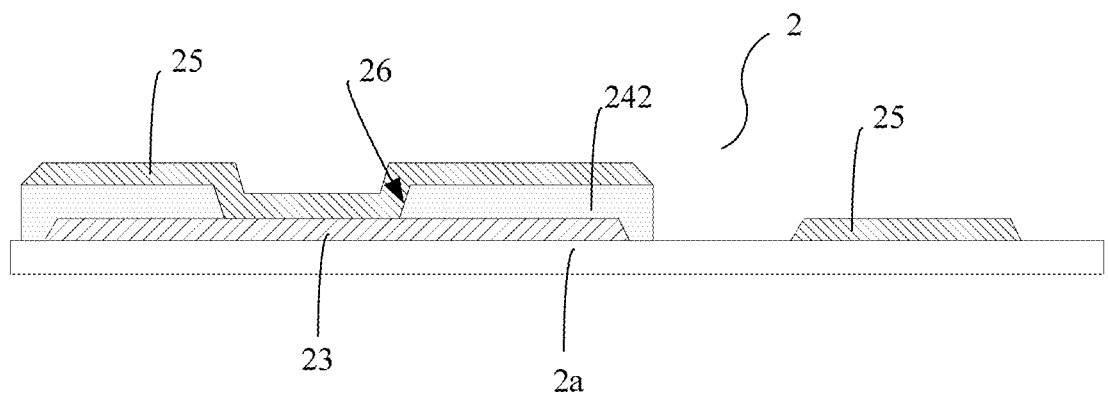
FIG. 12 is a schematic structural diagram of a flexible display substrate according to an embodiment of the present disclosure.

Exemplarily, FIG. 12 is a schematic diagram of a flexible display substrate according to an embodiment of the present disclosure. As shown in FIG. 12, the film layers in the first bonding region 21 include one source and drain layer 25 and one gate layer 23. An interlayer dielectric layer 242 is provided between the source and drain layer 25 and the gate layer 23. The film layers in the second bonding region 22 include one source and drain layer 25. It can be known from FIG. 12, the number of non-metal layers (the interlayer dielectric layer) in the first bonding region 21 is greater than the number of non-metal layers in the second bonding region 22, to enable the thickness of the first bonding region 21 to be greater than the second bonding region 22.

In the third type, the number of non-metal layers in the first bonding region is greater than the number of non-metal layers in the second bonding region, such that the thickness of the first bonding region is greater than the thickness of the second bonding region. Patterns of each of the non-metal layers are changed by only performing patterning is on each of the non-metal layers. In this embodiment, no process steps need to be added, and the practice is simple and convenient.

Optionally, when the number relationship between the film layers in the first bonding region and the film layers in the second bonding region is the fourth type, the number of film layers in the first bonding region 21 is the same as the number of film layers in the second bonding region 22. For the non-metal layers that are located in the same layer in the first bonding region 21 and the second bonding region 22, the thickness of the non-metal layers in the second bonding region 22 is less than the thickness of the non-metal layers in the first bonding region 21. the number of film layers in the first bonding region 21 is the same as the number of film layers in the second bonding region 22. The thickness of the metal layers in the first bonding region 21 is equal to the thickness of the second bonding region 22. However, the thickness of the non-metal layers in the first bonding region 21 is greater than the thickness of the non-metal layers in the second bonding region 22, thereby ensuring that a substrate thickness of the first bonding region 21 is greater than a substrate thickness of the second bonding region 22.

Figure 13:
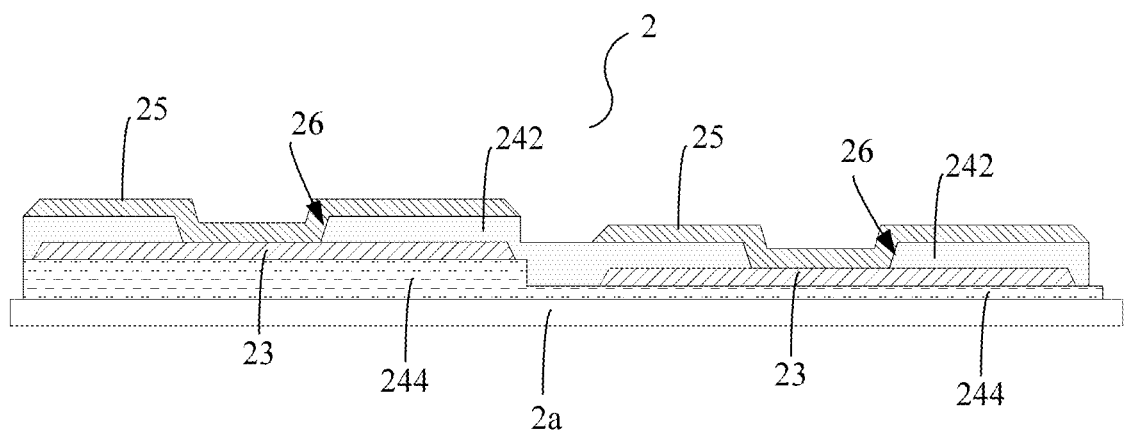
FIG. 13 is a schematic structural diagram of a flexible display substrate according to an embodiment of the present disclosure.

Exemplarily, FIG. 13 is a schematic diagram of a flexible display substrate according to an embodiment of the present disclosure. As shown in FIG. 13, the film layers in the first bonding region 21 include one source and drain layer 25 and one gate layer 23. An interlayer dielectric layer 242 is provided between the source and drain layer 25 and the gate layer 23, and a buffer layer 244 is provided between the gate layer 23 and the flexible display substrate 2. The film layers in the second bonding region 22 include one source and drain layer 25 and one gate layer 23. An interlayer dielectric layer 242 is provided between the source and drain layer 25 and the gate layer 23, and a buffer layer 244 is provided between the gate layer 23 and the flexible display substrate 2. It can be known from FIG. 13, the thickness of the buffer layer 244 in the first bonding region 21 is greater than the thickness of the buffer layer 244 in the second bonding region 22, and the thickness of other film layers in the first bonding region 21 is equal to the thickness of the corresponding film layers in the second bonding region, such that the thickness of the first bonding region 21 is greater than the thickness of the second bonding region 22. The thickness of the buffer layer 244 may be changed by changing a process parameter (for example, light intensity during photolithography).

According to still another configuration of the embodiment, the number of film layers 2*b* in the first bonding region 21 may be less than the number of film layers 2*b* in the second bonding region 22. When the number of film layers in the first bonding region is less than the number of film layers in the second bonding region, the thickness of a part of the film layers in the first bonding region may be greater than the thickness of the corresponding film layers in the second bonding region, such that the total thickness of the film layers in the first bonding region is greater than the total thickness of the film layers in the second bonding region. That is, the thickness of the first bonding region is greater than the thickness of the second bonding region.

Optionally, the film layers in the first bonding region may include m metal layers and x non-metal layers, the film layers in the second bonding region include n metal layers and y non-metal layers, wherein m and n are positive integers, and x and y are integers not less than 0. The total number of the film layers in the first bonding region may be less than the total number of the film layers in the second bonding region. In this embodiment, at least part of the film layers may be independently manufactured. The thickness of the at least part of the film layers in the first bonding region is increased to ensure that the total thickness of the film layers in the first bonding region is greater than the total thickness of the film layers in the second bonding region.

That is, the number relationship between the film layers in the first bonding region and the film layers in the second bonding region may be alternatively the fifth type: the number of metal layers in the first bonding region is less than the number of metal layers in the second bonding region, and the number of non-metal layers in the first bonding region is less than the number of non-metal layers in the second bonding region, that is, m<n, and x<y.

Alternatively, the number relationship between the film layers in the first bonding region and the film layers in the second bonding region may be alternatively the sixth type: the number of metal layers in the first bonding region is equal to the number of metal layers in the second bonding region, and the number of non-metal layers in the first bonding region is less than the number of non-metal layers in the second bonding region, that is, m=n, and x<y.

Alternatively, the number relationship between the film layers in the first bonding region and the film layers in the second bonding region may be alternatively the seventh type: the number of metal layers in the first bonding region is less than the number of metal layers in the second bonding region, and the number of non-metal layers in the first bonding region is equal to the number of non-metal layers in the second bonding region, that is, m<n, and x=y.

Exemplarily, the film layers in the first bonding region may include one metal layer, and the film layers in the second bonding region may include two metal layers. In addition, the film layers in the first bonding region may include one non-metal layer, and the film layers in the second bonding region may include two non-metal layers. To ensure that the thickness of the first bonding region is greater than the thickness of the second bonding region, it may be controlled that the thickness of one metal layer in the first bonding region is greater than the total thickness of two metal layers in the second bonding region, and the thickness of one non-metal layer the first bonding region is greater than the total thickness of two non-metal layers in the second bonding region. In this case, both the metal layers and the non-metal layers in the first bonding region and the second bonding region may be independently manufactured or at least partially independently manufactured. That is, the metal layer and/or the non-metal layers in the first bonding region and the metal layers and/or the non-metal layers in the second bonding region may be not formed by one patterning process, making it convenient to control the thickness of each of the film layers in the first bonding region and in the second bonding region.

It can be seen from the foregoing example, the non-metal layers in the first bonding region may include at least one of a gate insulating layer, an interlayer dielectric layer, a planarization layer, and a buffer layer. The non-metal layers in the second bonding region may be arranged in any of the following fashions:

In first arrangement, the non-metal layers in the second bonding region are the same as the non-metal layers in the first bonding region, and the thickness of at least one non-metal layer in the first bonding region is greater than the thickness of the corresponding non-metal layers in the second bonding region. Exemplarily, as shown in FIG. 12, the film layers in the first bonding region 21 and the film layers in the second bonding region 22 respectively include one buffer layer 244 and one interlayer dielectric layer 242. In addition, the thickness of the buffer layer 244 in the first bonding region 21 is greater than the thickness of the buffer layer 244 in the second bonding region 22.

In second arrangement, the non-metal layers in the second bonding region are partially the same as the non-metal layers in the first bonding region. For example, as shown in FIG. 8, the film layers in the first bonding region 21 and the film layers in the second bonding region 22 respectively include one gate insulating layer 241, and the film layers in the first bonding region 21 further include one interlayer dielectric layer 242.

In third arrangement, there is no non-metal layer in the second bonding region. Exemplarily, as shown in FIG. 13, the film layers in the first bonding region 21 include one interlayer dielectric layer 242, and there is no interlayer dielectric layer in the second bonding region 22.

The film layers 2*b* in the first bonding region 21 and the film layers 2*b* in the second bonding region 22 may both include at least one metal layer and at least one non-metal layer. That is, the film layers 2*b* located in the same layer in the first bonding region 21 and the second bonding region 22 may be metal layers or non-metal layers. Therefore, the thickness of the first bonding region 21 being greater than the thickness of the second bonding region 22 can be ensured by controlling that the thickness of a part of the metal layers or non-metal layers in the second bonding region 22 is less than the thickness of the corresponding film layers 2*b* in the first bonding region 21.

It needs to be noted that the thickness of the metal layer formed on the flexible base substrate is usually relatively small. The thickness a part of the metal layers in the second bonding region 22 is reduced, such that the thickness a part of the metal layers is less than the thickness of the corresponding film layers 2*b* in the first bonding region 21, to make that the effect that a thickness difference between the first bonding region 21 and the second bonding region 22 is not obvious. Therefore, the thickness a part of the non-metal layers in the second bonding region 22 being less than the thickness of the corresponding film layers 2*b* in the first bonding region 21 can be achieved by reducing the thickness a part of the non-metal layers in the second bonding region 22. The thickness of the first bonding region 21 being greater than the thickness of the second bonding region 22 can be achieved by in this way.

It needs to be noted that in in some embodiments, the film layers 2b located on one same side of one same film layer in the first bonding region 21 and the second bonding region 22 may be respectively formed by one patterning process.

Optionally, at least two adjacent metal layers of the m metal layers in the first bonding region 21 are connected by a via 26. A non-metal layer usually covers the metal layers to isolate the two adjacent metal layers. Therefore, a via is provided in a non-metal layer between the two adjacent metal layers, such that the two adjacent metal layers are connected by the via, the resistance of the first bonding region 21 can be made relatively low by providing a via on the non-metal layer between two adjacent metal layers, and connecting the adjacent two metal layers by the via, which is beneficial to signal transmission. Exemplarily, as shown in FIG. 7 and FIG. 10 to FIG. 13, the gate layer 23 and the source and drain layer 25 are connected by a via 26. As shown in FIG. 8, the first source and drain layer 251 and the second source and drain layer 252 are connected by the via 26. As shown in FIG. 9, the first source and drain layer 251 is connected to the second source and drain layer 252 by the via 26, and the first source and drain layer 251 is connected to the second gate layer 232 by the via 26.

Exemplarily, the metal layer may be made of Mo or TiAlTi. The gate insulating layer may be made of SiOx, SiNx, HfOx, SiON or AlOx, to provide adequate insulation. The interlayer dielectric layer is usually an insulating material having a low dielectric constant (the dielectric constant is less than 3), for example, a material such as silicon dioxide, boron-doped silica glass (BSG) or phosphorus-doped silica glass (PSG). When the dielectric constant of the material is lower, the insulating performance is better. The planarization layer may be made of a resin material, for example, a silicone material. The pixel defining layer may be made of PI. PI is a transparent material having relatively high insulation and can effectively implement insulation and reduce the absorption of light. The buffer layer may be used for increasing the bonding performance between the flexible base substrate and other film layers (for example, a metal layer or an active layer). The buffer layer may usually be made of an inorganic material such as SiNx, SiOx or the like.

It needs to be noted that, the metal layer, the gate insulating layer, the interlayer dielectric layer, the planarization layer, the buffer layer, and the pixel defining layer may also be made of a material in the prior art, which is not limited in the present disclosure.

It needs to be noted that in the foregoing embodiments, taking the first bonding region as a signal transmission region between the flexible display substrate and an electronic component, and the second bonding region as a non-signal transmission region between the flexible display substrate and an electronic component as an example. Alternatively, in other embodiments, the first bonding region and the second bonding region may both be signal transmission regions between the flexible display substrate and an electronic component. During the bonding of the electronic component, compared with the first bonding region, the second bonding region is provided with a larger pitch from the electronic component. When the first bonding region is recessed to cause a deformation to the flexible display substrate, the pitch between the second bonding region and the electronic component is still relatively large. Therefore, the electronic component and the flexible display substrate may be less likely to short circuit due to contact. In addition, the second bonding region is lower than the first bonding region, which can reduce the deformation of the flexible display substrate to some extent.

An embodiment of the present disclosure provides a display panel, including the foregoing flexible display substrate.

An embodiment of the present disclosure provides a display device, including the foregoing display panel. Exemplarily, the display device may be a mobile phone, a tablet computer, a television, a display, a notebook computer, a digital frame, a navigator or any other product or component having a display function.

Figure 14:
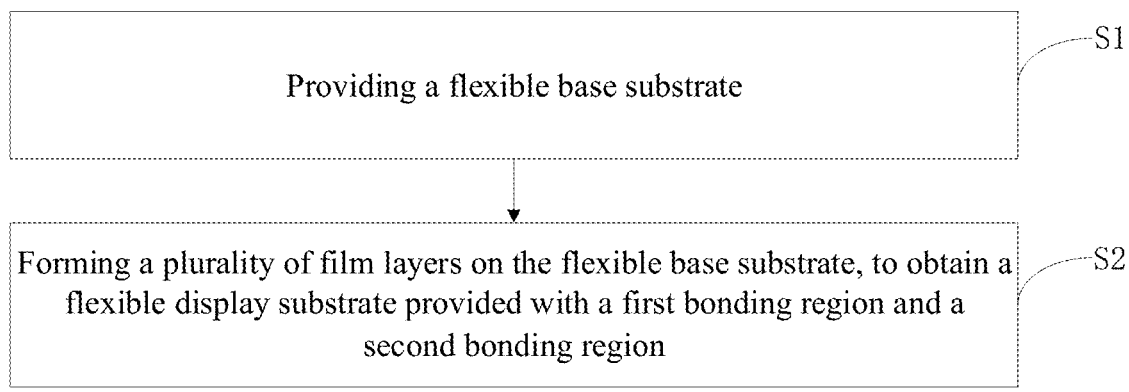
FIG. 14 is a flowchart of a manufacturing method of a flexible display substrate according to an embodiment of the present disclosure.

FIG. 14 is a flowchart of a manufacturing method of a flexible display substrate according to an embodiment of the present disclosure. As shown in FIG. 14, the manufacturing method includes the following steps.

In step S1, a flexible base substrate is provided.

In step S2, a plurality of film layers are formed on the flexible base substrate, to obtain a flexible display substrate provided with a first bonding region and a second bonding region.

The first bonding region is used for being bonded to an electronic component to perform signal transmission with the electronic component. The second bonding region is used for being bonded to an electronic component but is not used for signal transmission. A thickness of the flexible display substrate in the first bonding region is greater than a thickness of the flexible display substrate in the second bonding region in the direction perpendicular to the flexible display substrate.

The flexible display substrate provided in this embodiment of the present disclosure includes the first bonding region that performs signal transmission with the electronic component and a second bonding region that does not perform signal transmission with the electronic component, and the thickness of the flexible display substrate in the first bonding region is greater than the thickness of the flexible display substrate in the second bonding region, such that after the flexible display substrate is placed horizontally, the first bonding region is higher than the second bonding region. During the bonding of the electronic component, the first bonding region is connected to and bonded to the electronic component prior to the second bonding region. After the first bonding region has been bonded to the electronic component, the second bonding region whose thickness is less than the thickness of the first bonding region contacts the electronic component due to deformation and depression of the flexible display substrate, the second bonding region can achieve a support effect and increases the contact area between the flexible display substrate and the electronic component, thereby reducing further deformations of the flexible display substrate and improving the yield of a bonding process. In addition, the first bonding region is connected and bonded to the electronic component prior to the second bonding region, such that the bonding effect between the first bonding region and the electronic component can further be ensured in the present disclosure.

Optionally, forming the plurality of film layers on the flexible base substrate may include: sequentially forming the film layers by one patterning process in a film layer order distal from the flexible base substrate. The patterning process is to perform patterning on the film layers on the flexible base substrate. Required film layer patterns (for example, a gate layer and an insulating layer) may be formed on the film layers by patterning. One patterning process includes: forming a material layer on the flexible base substrate, and performing patterning on the material layer, such that the required film layer patterns (for example, a gate layer and an insulating layer) are formed in the first bonding region and the second bonding region at the same time. That is, the film layers formed in one patterning process are in the same layer.

Two fashions of forming the plurality of film layers on the flexible base substrate are used as examples for description below:

In a first fashion, the number of film layers in the first bonding region is greater than the number of film layers in the second bonding region, and the film layers in the second bonding region and part of film layers in the first bonding region are in the same layer.

In a second fashion, the number of film layers in the first bonding region is equal to the number of film layers in the second bonding region, and the film layers in the first bonding region and the second bonding region are all in the same layer.

In the first fashion, the film layers in the flexible display substrate 2 may include various structural forms. A process of forming film layers in the first bonding region and the second bonding region is described below in detail with reference to FIG. 15 to FIG. 17 by using an example in which the first bonding region of the flexible display substrate is provided with two metal layers (a gate layer and a source and drain layer) and one non-metal layer (a gate insulating layer) and the second bonding region has one metal layer (a source and drain layer) and one non-metal layer (a gate insulating layer).

Figure 15:
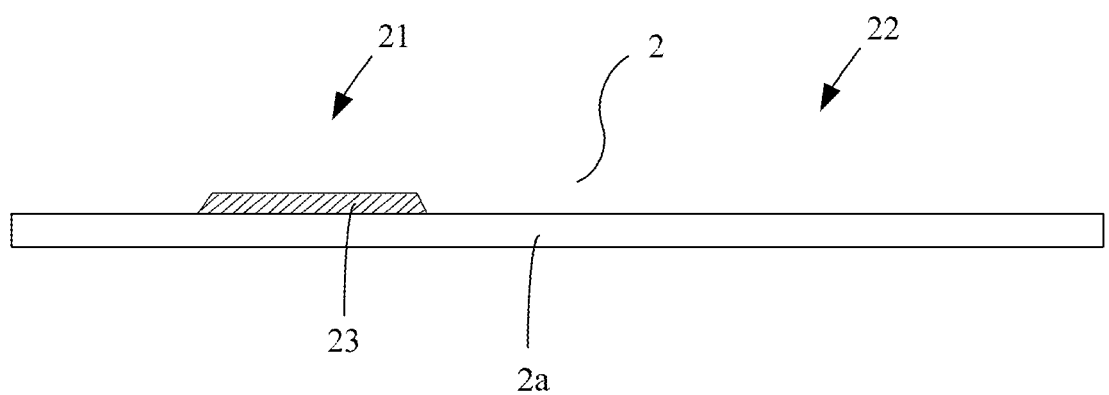
FIG. 15 is a diagram of a first state of manufacturing a flexible display substrate according to an embodiment of the present disclosure.

First, a first pattern is formed on the flexible base substrate. The first pattern includes a gate layer in the first bonding region. A process of forming the first pattern may include: forming one metal layer on the flexible base substrate, where the metal layer covers the non-display region of the flexible base substrate; and performing patterning on the metal layer, to remove a metal material in the second bonding region, and reserving a metal material in the first bonding region. For example, FIG. 15 is a diagram of a first state of manufacturing a flexible display substrate according to an embodiment of the present disclosure. As shown in FIG. 15, the patterning is performed on the metal layer located in the first bonding region 21, thereby forming one gate layer 23 in the first bonding region 21.

In addition, the first pattern may further include a signal trace, for example, a gate trace connecting a gate line in a display region to a bonding region. Certainly, to simplify a manufacturing process of the flexible display substrate, the metal layer may cover the entire surface of the flexible base substrate. The first pattern may further include a gate line, a gate or the like disposed in the display region.

Exemplarily, patterning usually includes steps such as film deposition, exposure, development, and etching.

The steps such as film deposition, exposure, development, and etching are described by using an example of forming a gate layer on the first bonding region. During the film deposition, one layer of photoresist is applied on the metal layer of the flexible base substrate. After the photoresist has been applied, a mask is used to cover the surface of the photoresist. Different masks correspond to different patterns. A gate layer is formed in this step, that is, a chosen mask has the foregoing first pattern. After the mask covers the photoresist, selective illumination is performed by using ultraviolet light, and chemical reactions occur at the photoresist in the illuminated part to change the solubility of this part of photoresist film in a developer. After development, the photoresist film shows patterns corresponding to the mask. The foregoing development process is a process of dissolving the illuminated part of the photoresist film in the developer. The etching is to use a corrosion solution to corrode the metal layer that is not protected by the photoresist or use dry etching to etch away the metal layer, such that the metal layer protected by the photoresist is kept to obtain the first pattern.

Figure 16:
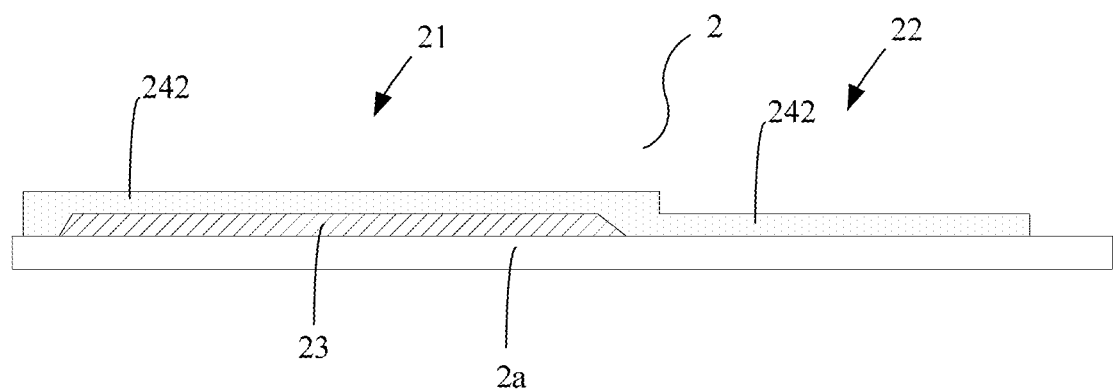
FIG. 16 is a diagram of a second state of manufacturing a flexible display substrate according to an embodiment of the present disclosure.

After the first pattern is formed, a gate insulating layer is formed on the flexible display substrate. FIG. 16 is a diagram of a second state of manufacturing a flexible display substrate according to an embodiment of the present disclosure. As shown in FIG. 16, one non-metal layer, that is, the gate insulating layer 242 (the gate insulating layer 242 covers both the first bonding region 21 and the second bonding region 22 of the flexible base substrate 2*a*), is formed on the gate layer 23 of the flexible base substrate 2*a*.

Exemplarily, the gate insulating layer may be formed by deposition.

Finally, a second pattern is formed on the gate insulating layer, and the second pattern includes a source and drain layer disposed in the first bonding region and the second bonding region. A process of forming the second pattern is the same as a process of forming the first pattern, the detailed description of which is omitted herein.

Figure 17:
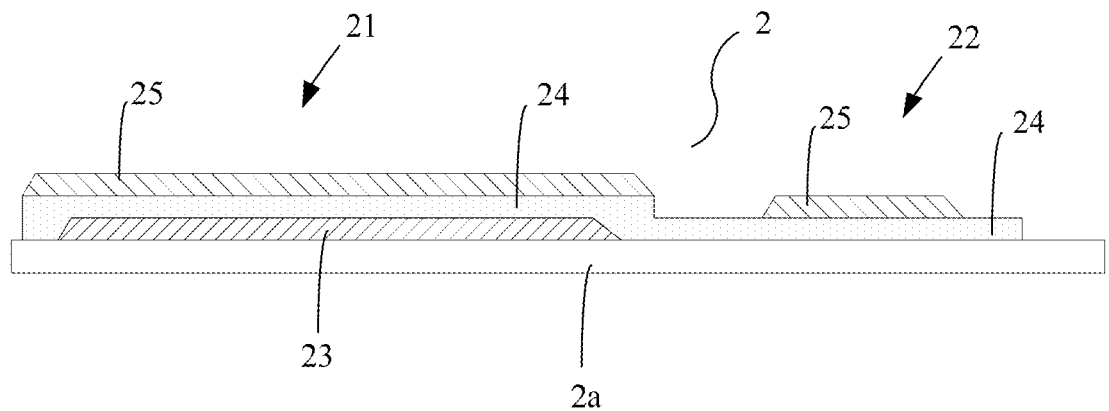
FIG. 17 is a schematic structural diagram of a flexible display substrate according to an embodiment of the present disclosure.

FIG. 17 is a schematic structural diagram of a flexible display substrate according to an embodiment of the present disclosure. As shown in FIG. 17, one metal layer (the metal layer covers both the first bonding region 21 and the second bonding region 22 of the flexible base substrate 2*a*) is formed on the gate insulating layer 241 of the flexible base substrate 2*a*. Patterning (the steps of patterning are consistent with those described above) is performed on the metal layers disposed in the first bonding region 21 and the second bonding region 22, to form the second pattern. The second pattern includes the source and drain layers 25 disposed in the first bonding region 21 and the second bonding region 22.

It needs to be noted that after the gate insulating layer is formed, a via may further be formed at a position, corresponding to the first bonding region in the gate insulating layer, such that subsequently the source and drain layer in the first bonding region may be connected to the gate layer in the first bonding region by the via. That is, the flexible display substrate with the structure shown in FIG. 7 is obtained.

In the second fashion, the film layers in the flexible display substrate 2 may include various structural forms. A process of forming the film layers in the first bonding region and the second bonding region is described below in detail with reference to FIG. 18 to FIG. 21 by using an example in which both the first bonding region and the second bonding region of the flexible display substrate are provided with two metal layers (a gate layer and a source and drain layer) and two non-metal layers (a buffer layer and a interlayer dielectric layer).

Figure 18:
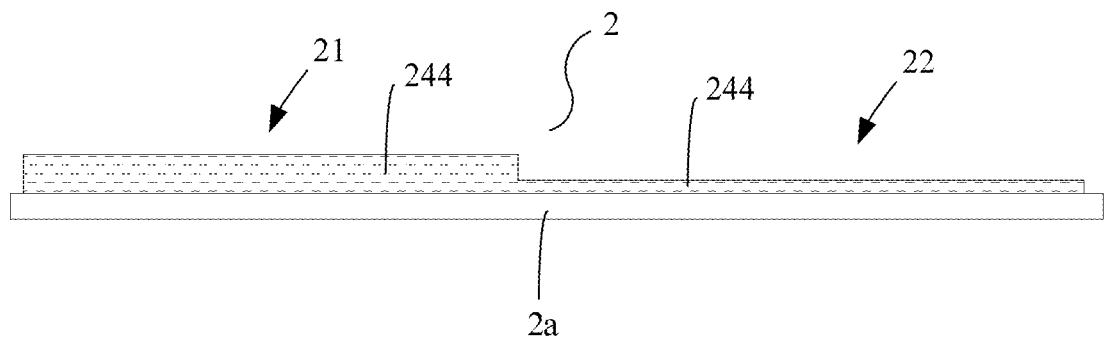
FIG. 18 is another diagram of a first state of manufacturing a flexible display substrate according to an embodiment of the present disclosure.

First, the buffer layer is formed on the flexible base substrate. FIG. 18 is another diagram of a first state of manufacturing a flexible display substrate according to an embodiment of the present disclosure. As shown in FIG. 18, one non-metal layer, that is, the buffer layer 244 (the buffer layer 244 covers both the first bonding region 21 and the second bonding region 22 of the flexible base substrate 2*a*), is formed on the flexible base substrate 2*a*.

Exemplarily, the buffer layer may be formed by deposition. In some embodiments, during the formation of the buffer layer, the buffer layers disposed in the first bonding region and the second bonding region may be etched to ensure that a thickness of the buffer layer in the first bonding region is greater than a thickness of the buffer layer in the second bonding region.

Figure 19:
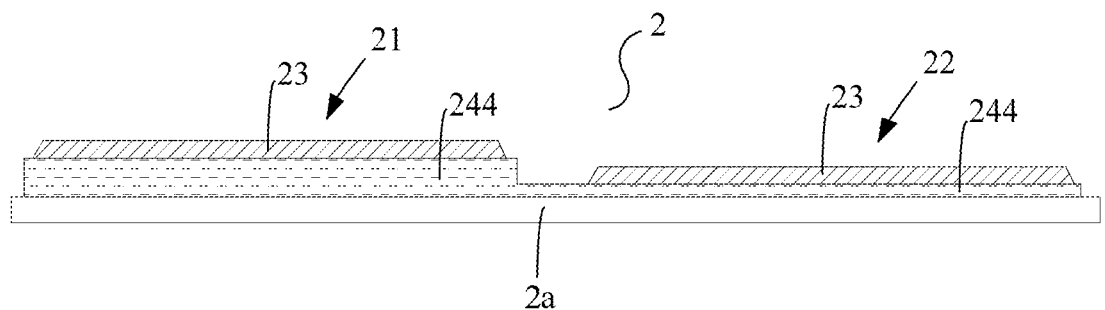
FIG. 19 is another diagram of a second state of manufacturing a flexible display substrate according to an embodiment of the present disclosure.

Then, the first pattern is formed on the buffer layer of the flexible base substrate. The first pattern includes a gate layer in the first bonding region and the second bonding region. A process of forming the first pattern may include: forming one metal layer on a planarization layer of the flexible base substrate, where the metal layer covers non-display regions of the flexible base substrate; and performing patterning on the metal layer, and reserving the metal materials in the first bonding region and the second bonding region. For example, FIG. 19 is another diagram of a second state of manufacturing a flexible display substrate according to an embodiment of the present disclosure. As shown in FIG. 19, the patterning is performed on the metal layers disposed in the first bonding region 21 and the second bonding region 22, thereby forming one gate layer 23 in the first bonding region 21 and the second bonding region 22.

In addition, the first pattern may further include a signal trace, for example, a gate trace connecting a gate line in a display region to a bonding region. Certainly, to simplify a manufacturing process of the flexible display substrate, the metal layer may cover the entire surface of the flexible base substrate. The first pattern may further include a gate line and a gate disposed in the display region.

Exemplarily, patterning usually includes steps such as film deposition, exposure, development, and etching. A specific process of patterning is the same as those described above, which is not repeated in this embodiment.

Figure 20:
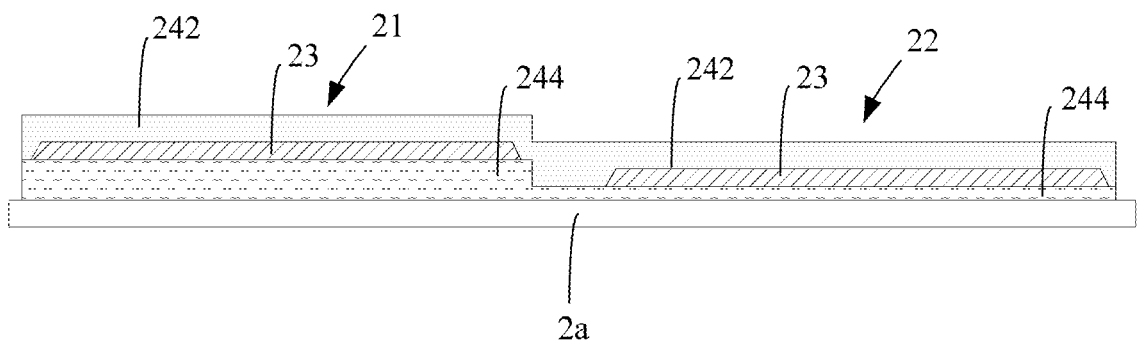
FIG. 20 is another diagram of a third state of manufacturing a flexible display substrate according to an embodiment of the present disclosure.

Then, after the first pattern is formed, an interlayer dielectric layer is formed on the flexible display substrate. FIG. 20 is a diagram of a third state of manufacturing a flexible display substrate according to an embodiment of the present disclosure. As shown in FIG. 20, one non-metal layer, that is, the interlayer dielectric layer 242 (the interlayer dielectric layer 242 covers both the first bonding region 21 and the second bonding region 22 of the flexible base substrate 2a), is formed on the gate layer 23 of the flexible base substrate 2a.

Exemplarily, the interlayer dielectric layer may be formed by deposition.

Finally, a second pattern is formed on the interlayer dielectric layer 242, and the second pattern includes a source and drain layer 25 disposed in the first bonding region 21 and the second bonding region 22. A process of forming the second pattern is the same as a process of forming the first pattern, the detailed description of which is omitted herein.

Figure 21:
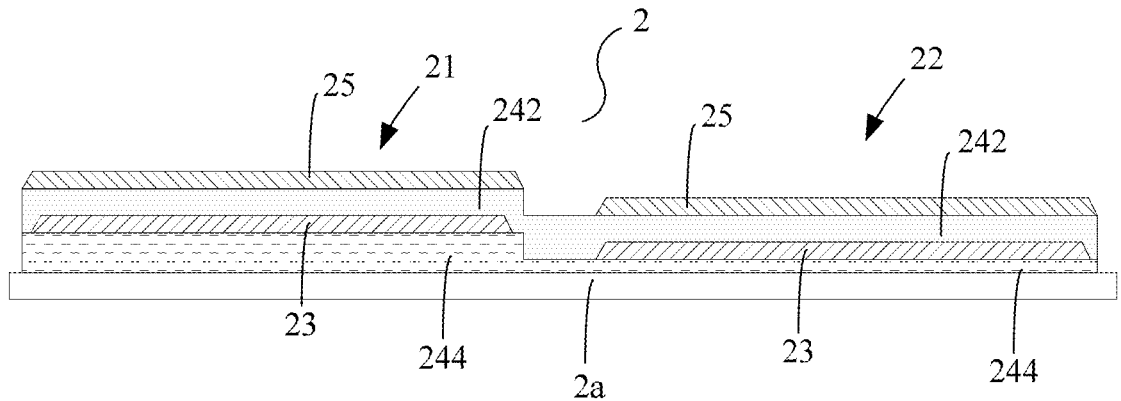
FIG. 21 is another schematic structural diagram of manufacturing a flexible display substrate according to an embodiment of the present disclosure.

FIG. 21 is another schematic structural diagram of manufacturing a flexible display substrate according to an embodiment of the present disclosure. As shown in FIG. 21, one metal layer (the metal layer covers both the first bonding region 21 and the second bonding region 22 of the flexible base substrate 2a) is formed on the interlayer dielectric layer 242 of the flexible base substrate 2a. The metal layers disposed in the first bonding region 21 and the second bonding region 22 are subjected to patterning (the steps of patterning are consistent with those described above), to form the second pattern. The second pattern includes the source and drain layers 25 disposed in the first bonding region 21 and the second bonding region 22.

It needs to be noted that after the interlayer dielectric layer is formed, a via may further be formed at a position, corresponding to the first bonding region in the interlayer dielectric layer, such that subsequently the source and drain layer in the first bonding region may be connected to the gate layer in the first bonding region by the via. That is, the flexible display substrate with the structure shown in FIG. 11 is obtained.

The above are just the preferred embodiments of the present disclosure, which will not limit the present disclosure. Any modifications, equivalent replacements and improvements made within the spirits and principles of the present disclosure shall all fall in the protection scope of the present disclosure.

What is claimed is:

1. A flexible display substrate, wherein the flexible display substrate is provided with a first bonding region and a second bonding region;
   wherein the first bonding region and second bonding region are configured to be bonded to an electronic component;
   a thickness of the flexible display substrate in the first bonding region is greater than a thickness of the flexible display substrate in the second bonding region in a direction perpendicular to the flexible display substrate; and
   the flexible display substrate is provided with an input region and an output region that are arranged at an interval, the first bonding region is respectively arranged in the input region and the output region, and the second bonding region is arranged between the input region and the output region.

2. The flexible display substrate according to claim 1, wherein the first bonding region is configured as a signal transmission region between the flexible display substrate and the electronic component, and the second bonding region is configured as a non-signal transmission region between the flexible display substrate and the electronic component.

3. The flexible display substrate according to claim 1, comprising a flexible base substrate and a plurality of film layers on the flexible base substrate, wherein the film layers in the second bonding region and at least part of the film layers in the first bonding region are in the same layer.

4. The flexible display substrate according to claim 3, wherein the number of film layers in the first bonding region is greater than the number of film layers in the second bonding region, and a thickness of the film layers in the first bonding region is equal to a thickness of the film layers that are in the same layer in the second bonding region.

5. The flexible display substrate according to claim 4, wherein the film layers in the first bonding region comprise m metal layers and x non-metal layers, the film layers in the second bonding region comprise n metal layers and y non-metal layers, wherein m and n are positive integers, x and y are integers not less than 0, and m, n, x, and y meet any of the following relationships:
   $m>n$, and $x>y$;
   $m>n$, and $x=y$; and
   $m=n$, and $x>y$.

6. The flexible display substrate according to claim 5, wherein the film layers in the first bonding region and the second bonding region are arranged according to any of the following configurations:
   the film layers in the first bonding region comprise a gate layer, an interlayer dielectric layer, and a source and drain layer that are sequentially on the base substrate, and the film layers in the second bonding region comprise an interlayer dielectric layer and a source and drain layer that are sequentially on the base substrate;
   the film layers in the first bonding region comprise a first gate layer, a gate insulating layer, a second gate layer, an interlayer dielectric layer, and a source and drain layer that are sequentially on the base substrate, and the film layers in the second bonding region comprise an interlayer dielectric layer and a source and drain layer that are sequentially on the base substrate;

the film layers in the first bonding region comprise a gate layer, an interlayer dielectric layer, a first source and drain layer, a planarization layer, and a second source and drain layer that are sequentially on the base substrate, and the film layers in the second bonding region comprise an interlayer dielectric layer and one of the first source and drain layer and the second source and drain layer that are sequentially on the base substrate;

the film layers in the first bonding region comprise a gate layer, an interlayer dielectric layer, a first source and drain layer, a planarization layer, and a second source and drain layer that are sequentially on the base substrate, and the film layers in the second bonding region comprise a gate layer, an interlayer dielectric layer, and one of the first source and drain layer and the second source and drain layer that are sequentially on the base substrate;

the film layers in the first bonding region comprise a first gate layer, a gate insulating layer, a second gate layer, an interlayer dielectric layer, a first source and drain layer, a planarization layer, and a second source and drain layer that are sequentially on the base substrate, and the film layers in the second bonding region comprise a first gate layer, a gate insulating layer, and one of the first source and drain layer and the second source and drain layer that are sequentially on the base substrate;

the film layers in the first bonding region comprise a first gate layer, a gate insulating layer, a second gate layer, an interlayer dielectric layer, a first source and drain layer, a planarization layer, and a second source and drain layer that are sequentially on the base substrate, and the film layers in the second bonding region comprise a gate insulating layer and one of the first source and drain layer and the second source and drain layer that is on the base substrate that are sequentially on the base substrate;

the film layers in the first bonding region comprise a buffer layer, a gate layer, an interlayer dielectric layer, and a source and drain layer that are sequentially on the base substrate, and the film layers in the second bonding region comprise a gate layer, an interlayer dielectric layer, and a source and drain layer that are sequentially on the base substrate; and the film layers in the first bonding region comprise a gate layer, an interlayer dielectric layer, and a source and drain layer that are sequentially on the base substrate, and the film layers in the second bonding region comprise a source and drain layer on the base substrate.

7. The flexible display substrate according to claim 5, wherein at least two of the m metal layers in the first bonding region are connected by a via.

8. The flexible display substrate according to claim 3, wherein the number of film layers in the first bonding region is greater than or equal to the number of film layers in the second bonding region, and for the film layers in the same layer in the first bonding region and the second bonding region, a thickness of the at least part of the film layers in the second bonding region is less than a thickness of the corresponding film layers in the first bonding region.

9. The flexible display substrate according to claim 8, wherein the film layers in the first bonding region comprise m metal layers and x non-metal layers, the film layers in the second bonding region comprise n metal layers and y non-metal layers, wherein m, n, x, and y are positive integers, m≥n, and x≥y;

a thickness of the metal layer in the first bonding region is equal to a thickness of the metal layers in the same layer in the second bonding region, and a thickness of at least one non-metal layer in the second bonding region is less than a thickness of non-metal layers in the same layer in the first bonding region.

10. The flexible display substrate according to claim 9, wherein the film layers in the first bonding region and the film layers in the second bonding region respectively comprise a buffer layer, a gate layer, an interlayer dielectric layer, and a source and drain layer that are sequentially on the base substrate, wherein a thickness of the buffer layer in the second bonding region is less than a thickness of the buffer layer in the first bonding region.

11. The flexible display substrate according to claim 3, comprising a display region and a non-display region, wherein the first bonding region and the second bonding region are in the non-display region, and a thickness of the flexible display substrate in the display region is greater than a thickness of the flexible display substrate in the first bonding region in the direction perpendicular to the flexible display substrate.

12. The flexible display substrate according to claim 11, wherein the film layers in the display region comprise an active layer, a gate insulating layer, a gate layer, an interlayer dielectric layer, a source and drain layer, a planarization layer, and an electrode layer that are sequentially on the base substrate in a stacking fashion, wherein the gate layer is one of a single layer structure and a double layer structure, and the source and drain layer is one of a single layer structure and a double layer structure.

13. The flexible display substrate according to claim 1, wherein the second bonding region is provided on two sides of the first bonding region in a direction perpendicular to an arrangement direction of the input region and the output region.

14. A display panel, comprising a flexible display substrate;

wherein the flexible display substrate is provided with a first bonding region and a second bonding region;

wherein the first bonding region and second bonding region are configured to be bonded to an electronic component;

a thickness of the flexible display substrate in the first bonding region is greater than a thickness of the flexible display substrate in the second bonding region in a direction perpendicular to the flexible display substrate; and the flexible display substrate is provided with an input region and an output region that are arranged at an interval, the first bonding region is respectively arranged in the input region and the output region, and the second bonding region is arranged between the input region and the output region.

15. A display device, comprising the display panel as defined in claim 14.

16. A manufacturing method of a flexible display substrate, comprising:

providing a flexible base substrate; and forming a plurality of film layers on the flexible base substrate, to obtain a flexible display substrate provided with a first bonding region and a second bonding region, wherein the first bonding region and the second bonding region are configured to be bonded to an electronic component; a thickness of the flexible display substrate in the first bonding region is greater than a thickness of the flexible display substrate in the second bonding region in a direction perpendicular to the flexible display substrate; and the flexible display substrate is provided with an input region and an output region that are arranged at an interval, the first bonding region is respectively arranged in the input region and the output region, and the second bonding region is arranged between the input region and the output region.

17. The manufacturing method of a flexible display substrate according to claim 16, wherein forming the plurality of film layers on the flexible base substrate comprises:
sequentially forming the film layers by one patterning process in a film layer order distal from the flexible base substrate.

18. The manufacturing method of a flexible display substrate according to claim 16, wherein the first bonding region is configured as a signal transmission region between the flexible display substrate and the electronic component, and the second bonding region is configured as a non-signal transmission region between the flexible display substrate and the electronic component.

* * * * *